US008472203B2

(12) United States Patent
Dabov et al.

(10) Patent No.: US 8,472,203 B2
(45) Date of Patent: Jun. 25, 2013

(54) ASSEMBLY OF A HANDHELD ELECTRONIC DEVICE

(75) Inventors: Teodor Dabov, Mountain View, CA (US); Fletcher R. Rothkopf, Mountain View, CA (US); Philippe Manoux, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 874 days.

(21) Appl. No.: 12/204,350

(22) Filed: Sep. 4, 2008

(65) Prior Publication Data
US 2009/0067141 A1   Mar. 12, 2009

Related U.S. Application Data

(60) Provisional application No. 60/967,565, filed on Sep. 4, 2007.

(51) Int. Cl.
| H05K 5/00 | (2006.01) |
|---|---|
| H05K 7/14 | (2006.01) |
| H05K 5/02 | (2006.01) |
| H05K 9/00 | (2006.01) |
| H04M 1/00 | (2006.01) |

(52) U.S. Cl.
USPC ........... 361/753; 361/799; 361/814; 361/816; 361/818; 455/575.5; 455/575.7

(58) Field of Classification Search
USPC   455/575.1, 575.2, 575.5, 97, 575.7; 174/535; 343/702; 361/753, 799, 814, 816, 818
See application file for complete search history.

(56) References Cited

U.S. PATENT DOCUMENTS

| 5,861,850 | A   | * | 1/1999  | Robertson et al. ............ 343/702 |
|---|---|---|---|---|
| 6,031,494 | A   | * | 2/2000  | Okabe et al. .................. 343/702 |
| 6,147,660 | A   | * | 11/2000 | Elliott ............................ 343/895 |
| 6,867,738 | B2  | * | 3/2005  | Birnbaum et al. ............. 343/702 |
| 7,080,787 | B2  | * | 7/2006  | Wulff et al. ............... 235/462.45 |
| 7,132,987 | B1  | * | 11/2006 | Olsson et al. ................. 343/702 |
| 7,642,972 | B1  | * | 1/2010  | Yu et al. ........................ 343/702 |
| 2001/0051046 | A1 | * | 12/2001 | Watanabe et al. ............. 396/287 |
| 2002/0082061 | A1 | * | 6/2002  | Tou et al. ....................... 455/575 |
| 2002/0111185 | A1 | * | 8/2002  | Geeraert et al. .............. 455/550 |
| 2002/0126236 | A1 | * | 9/2002  | Hiratsuka et al. ............... 349/58 |
| 2003/0016519 | A1 | * | 1/2003  | Bachman ....................... 361/818 |
| 2004/0001022 | A1 | * | 1/2004  | Silzer, Jr. ....................... 343/702 |
| 2005/0017910 | A1 | * | 1/2005  | Park ............................... 343/702 |
| 2005/0020214 | A1 | * | 1/2005  | Neill et al. ....................... 455/73 |
| 2005/0024270 | A1 | * | 2/2005  | Zheng et al. .................. 343/702 |
| 2005/0024274 | A1 | * | 2/2005  | Byun et al. .................... 343/702 |
| 2005/0162320 | A1 | * | 7/2005  | Huang et al. .................. 343/702 |
| 2005/0170858 | A1 | * | 8/2005  | Tao ............................ 455/550.1 |
| 2006/0160585 | A1 | * | 7/2006  | Miyagawa et al. ......... 455/575.7 |

(Continued)

Primary Examiner — Timothy Thompson
Assistant Examiner — Sherman Ng
(74) Attorney, Agent, or Firm — Womble Carlyle Sandridge & Rice LLP

(57) ABSTRACT

This invention is directed to several mechanical features of an electronic device. The electronic device may include a spring for simultaneously grounding several components. The electronic device may include several interlocking fences for protecting electronic device components from RF radiation. The electronic device may include an antenna assembly that includes distinct components for functional and aesthetic purposes. The electronic device may include a window for permitting RF transmissions. The electronic device may include a metal frame for stiffening the electronic device. The electronic device may include a bezel used for aesthetic purposes and to support numerous electronic device components. The electronic device may include a flexible housing operative to elastically deform to assemble the electronic device. The electronic device may include an unsupported button.

10 Claims, 18 Drawing Sheets

U.S. PATENT DOCUMENTS

| | | | |
|---|---|---|---|
| 2007/0001912 A1* | 1/2007 | Ji | 343/700 MS |
| 2007/0010302 A1* | 1/2007 | Timms | 455/575.7 |
| 2007/0040755 A1* | 2/2007 | Na et al. | 343/702 |
| 2007/0057856 A1* | 3/2007 | Na | 343/702 |
| 2007/0290932 A1* | 12/2007 | Morris et al. | 343/702 |
| 2009/0040115 A1* | 2/2009 | Zhang et al. | 343/702 |

* cited by examiner

ASSEMBLY OF A HANDHELD ELECTRONIC DEVICE

CROSS-REFERENCE TO RELATED APPLICATION

This application claims the benefit of U.S. Provisional Patent Application No. 60/967,565, filed Sep. 4, 2007, which is incorporated by reference herein in its entirety.

BACKGROUND OF THE INVENTION

This invention is directed to mechanical features of an electronic device.

SUMMARY OF THE INVENTION

An electronic device is provided. In some embodiments, the electronic device may include a spring for grounding a bezel, a housing, and an antenna board of the electronic device. The spring may include a base that has several of apertures, each aperture operative to receive a post extending from the top surface of a wall of the bezel. The spring may also include an inner tab extending from the base that follows the inner surface of the bezel wall and is operative to contact the antenna board mounted in the bezel. The spring may also include an outer tab extending from the base following the outer surface of the bezel wall and operative to contact the housing when the bezel is engaged with the housing.

In some embodiments, the bezel and housing of the electronic device may be electrically coupled and serve as a ground for the electronic device components. Electronic device components mounted in the housing may be electrically coupled to a circuit board of the bezel using a spring, and coupled to the housing to ground the component, for example using a flex (e.g., instead of being grounded to the board using a second connection).

The electronic device may include a circuit board protected from RF radiation. The circuit board may include a first board and a second board, the first board coupled to the second board by at least one flex tab. The circuit board may further include a first fence placed around the periphery of the components of the first board, and including at least one tab with a snap extending beyond the fence. The circuit board may still further include a second fence placed around the periphery of the components of the second board, and including at least one slot in the second fence. The first board may be operative to be placed over the second board by folding the circuit board with the at least one flex such that the first fence may be coupled to the second fence by engaging the tab and snap of the first fence with the slot of the second fence.

The electronic device may include one or more circuit boards. A circuit board may include a first board, a second board, a first flex tab electrically coupling the first board and the second board, and a second flex tab coupling the first board and the second board. The first board may be folded over the second board by bending the flex tabs.

The electronic device may include one or more antennas for performing wireless communications. In some embodiments, the electronic device may include an antenna chassis for receiving an antenna placed adjacent to an aperture in the housing. The electronic device may also include an antenna cap for closing the aperture, where the antenna cap may be inserted in the aperture from the outside of the housing by deforming the antenna cap. In some embodiments, the bezel may include a window for allowing radiation to pass through the front surface of the electronic device to enhance wireless communications. A screen or display inserted in the bezel may be rendered partially opaque to hide the window from view.

In some embodiments, the electronic device may include a plate operative to be coupled to the bezel behind the screen to support the screen. The plate may be rigid such that, when coupled to the bezel (e.g., using screws), the combination of the plate and bezel is stiff and resists to both torsion and bending stresses.

In some embodiments, the bezel may be used both as an aesthetically pleasing or as a cosmetic component, and as a functional component for supporting the components of the electronic device. In some embodiments, all or substantially all of the electronic device components may be mounted to the bezel.

The electronic device may be assembled using any suitable approach. In some embodiments, the bezel may include a slot operative to receive a latch welded into the housing. When the bezel is inserted in the housing, the housing may elastically deform to let the bezel pass, then return to its initial position once the latches engage the bezel slots.

In some embodiments, the electronic device may include a button (e.g., a home button). Because of the limited space inside the electronic device, the button may not be mounted on a distinct component, but may instead be captured by the bezel and the screen. The button may include several flanges extending from the button that may be received by slots in the bezel. Once in the button is in the bezel, the screen may be placed in the bezel such that only the center of the button (i.e., not the flanges) is accessible through the screen and the flanges are trapped between the bezel and the screen. The button may be directly coupled to a dome switch mounted on a circuit board located underneath the switch.

BRIEF DESCRIPTION OF THE DRAWINGS

The above and other features of the present invention, its nature and various advantages will be more apparent upon consideration of the following detailed description, taken in conjunction with the accompanying drawings, and in which.

DETAILED DESCRIPTION

Figure 1A:
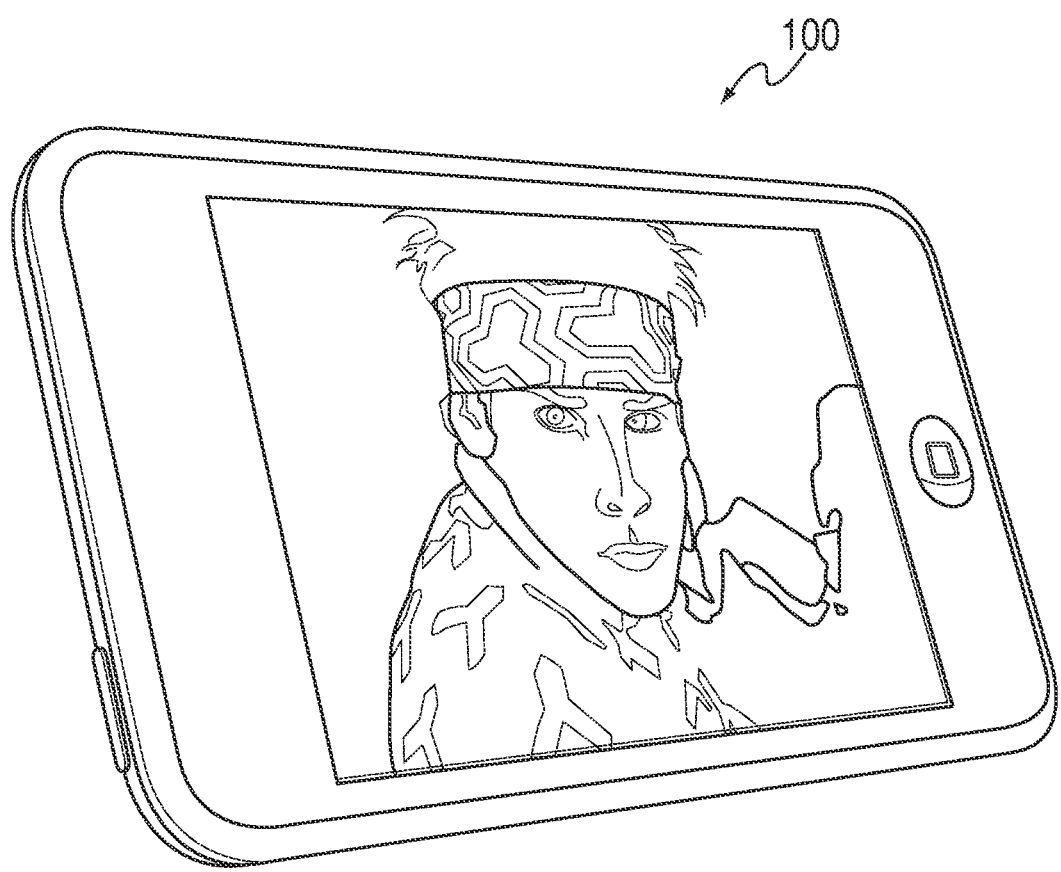
FIG. 1A is a schematic view of a grounding spring placed between a bezel and an antenna board of an electronic device in accordance with one embodiment of the invention.

FIG. 1A is a schematic view of an illustrative electronic device in accordance with one embodiment of the invention. Electronic device 100 may include any suitable type of electronic device, including for example a media player such as an iPod® available by Apple Inc., of Cupertino, Calif., a cellular telephone (e.g., an iPhone® available from Apple Inc.), a personal digital assistant, a desktop computer, a laptop computer, gaming console, set-top box, television system or television system component (e.g., a recording device), or any other suitable electronic device. Electronic device 100 may include a case formed from a bezel and a housing, a screen for displaying information to a user, and a user interface (e.g., a button) for providing inputs to the device.

Figure 1B:
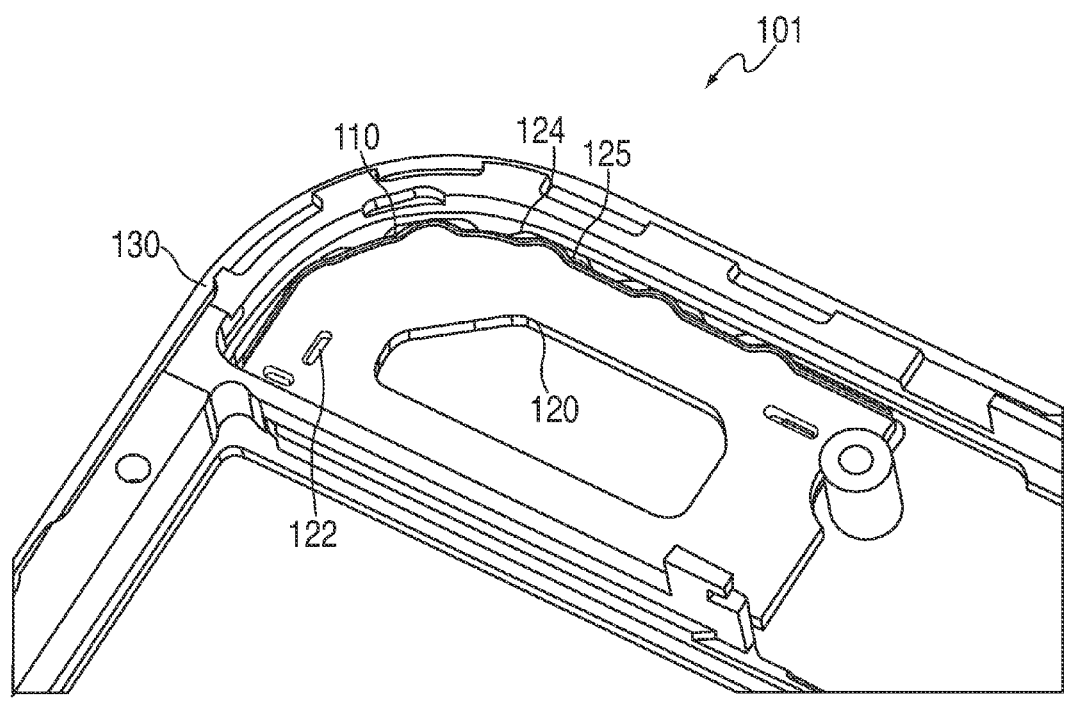
FIG. 1B is a schematic view of a grounding spring placed between a bezel and an antenna board of an electronic device in accordance with one embodiment of the invention.
Figure 1C:
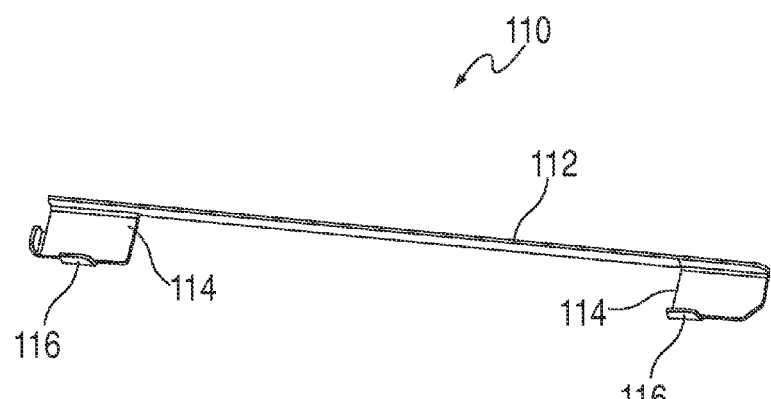
FIG. 1C is a schematic view of the grounding spring of FIG. 1B in accordance with one embodiment of the invention.

FIG. 1B is a schematic view of a grounding spring placed between a bezel and an antenna board of an electronic device in accordance with one embodiment of the invention. FIG. 1C is a schematic view of the grounding spring of FIG. 1B in accordance with one embodiment of the invention. Electronic device 100 may include bezel 130, which may act as a ground for the electronic device components of the electronic device. The electronic device may include an antenna for performing wireless communications (e.g., using RF waves, as described in more detail below). To improve the performance of the antenna, it may be desirable to ground antenna board 120, which may be part of the antenna assembly, to bezel 130. Antenna board 120 may be ground to bezel 130 using any suitable approach. In some embodiments, a grounding spring may be placed between antenna board 120 and bezel 130. For example, a spring constructed from electrically conductive material (e.g., a metal) may be inserted between antenna board 120 and bezel 130.

Grounding spring 110 may be any suitable spring for grounding antenna board 120. Grounding spring 110 may include elongated strip 112, which may be operative to deform elastically when it is placed between antenna board 120 and bezel 130. At each tip of strip 112, spring 110 may include plate 114 that includes one or more tabs 116. Each plate 114 may be operative to fit into a structure of antenna board 120 when spring 110 is placed between antenna board 120 and bezel 130 such that tabs 116 extend into slots 122 of antenna board 120, thus retaining spring 110 in its position.

Spring 110 may be operative to deform elastically to accommodate for bumps 124 and grooves 125 in each of antenna housing 120 and bezel 130. For example, antenna housing 120 and bezel 130 may include interlocking, wavy, or rippled surfaces to which spring 110 may conform. The redundant contacts due to the wavy nature of the interface, and of the spring in contact with the interface may provide a redundant and more consistent grounding mechanism. The elastic deformation of spring 110 may cause spring 110 to remain retained between antenna board 120 and bezel 130, even during drop events or other impacts, such that antenna board 120 always remains grounded to bezel 130.

Figure 2A:
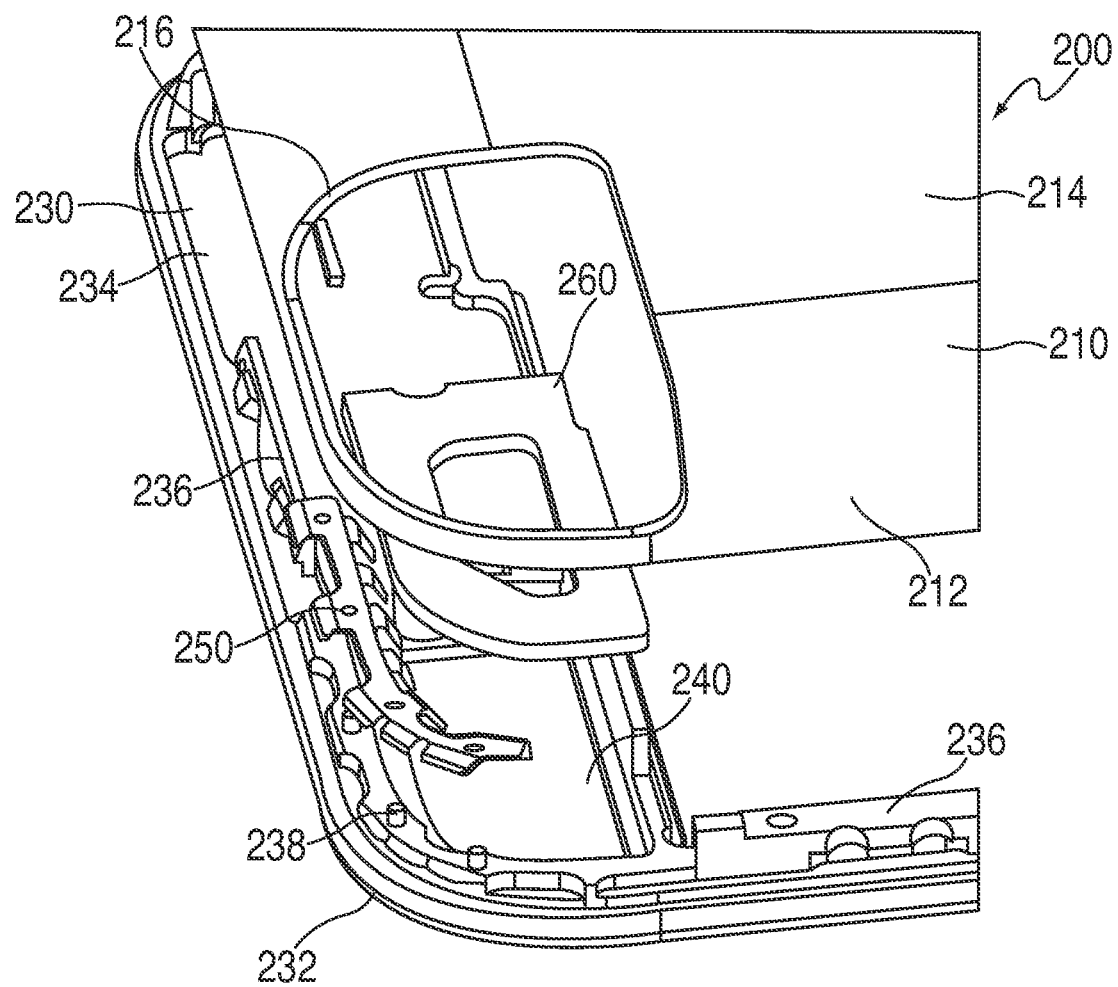
FIG. 2A is a perspective view of an electronic device having a spring for grounding several components of the electronic device in accordance with one embodiment of the invention.

FIG. 2A is a perspective view of an electronic device having a spring for grounding several components of the electronic device in accordance with one embodiment of the invention. Electronic device 200 may include housing 210 and bezel 230, which may be coupled to form the outer shell of electronic device 200. Housing 210 may include plate 212 and side walls 214. Plate 212 may form the back surface of electronic device 200. In some embodiments, plate 212 may define a substantially flat surface (e.g., a flat surface or a surface with a small curvature defined, for example, by a spline). Side walls 214 may extend from plate 212 to form at least a portion of the walls of electronic device 200. Walls 214 may include a curved surface by which the curvature of housing 210 changes from substantially parallel to plate 212 (e.g., horizontal) to substantially perpendicular to plate 212 (e.g., substantially vertical). In some embodiments, walls 214 may be short (e.g., in the range of 1 to 4 mm) such that only a small amount of the total height of walls 214 consists of material substantially perpendicular to plate 212 (e.g., vertical material).

Housing 210 may be manufactured from any suitable material and using any suitable process. For example, housing 210 may be manufactured from a metal (e.g., aluminum or stainless steel), a composite material, plastic, or any other suitable material. Housing 210 may be manufactured using any suitable approach, including for example forming, forging, extruding, machining, molding, stamping, combinations thereof, or any other suitable manufacturing process.

Housing 210 may include any suitable feature for coupling housing 210 to bezel 230 or for receiving other electronic device components. For example, housing 210 may include aperture 216 for receiving an antenna assembly. As another example, the inner surface of walls 214 may include slots or a component having slots operative to receive snaps of bezel 230 used to couple bezel 230 to housing 210. As still another example, housing 210 may include features for supporting a circuit board or battery of the electronic device.

Bezel 230 may include curved outer surface 232 operative to form a flush coupling with walls 214 of housing 210. Bezel 230 may include a number features on inner surface 234 for receiving electronic device components or for coupling bezel 230 to housing 210. In some embodiments, bezel 230 may include one or more walls 236 having snaps operative to engage housing 210 when electronic device 200 is assembled, as discussed in more detail below. Walls 236 may be located around the periphery of bezel 230 as a continuous wall or as several discreet walls (e.g., one discreet wall along each side of the bezel). In some embodiments, a portion of walls 236 may include one or more posts 238 operative to receive grounding spring 250. In some embodiments, bezel 230 may include aperture 240 operative to receive antenna board 260.

Bezel 230 may be manufactured from any suitable material and using any suitable process. For example, bezel 230 may be manufactured from a metal (e.g., aluminum or stainless steel), a composite material, plastic, or any other suitable material. Bezel 230 may be manufactured using any suitable approach, including for example forming, forging, extruding, machining, molding, stamping, combinations thereof, or any other suitable manufacturing process.

Electronic device 200 may include antenna board 260 operative to support an antenna for wireless communications. For example, antenna board 260 may include an antenna and associated circuitry for conducting communications over an RF communications link, a microwave communications link, an IR communications link, or any other communications link (e.g., using any suitable frequency in the electro-magnetic spectrum).

Figure 2B:
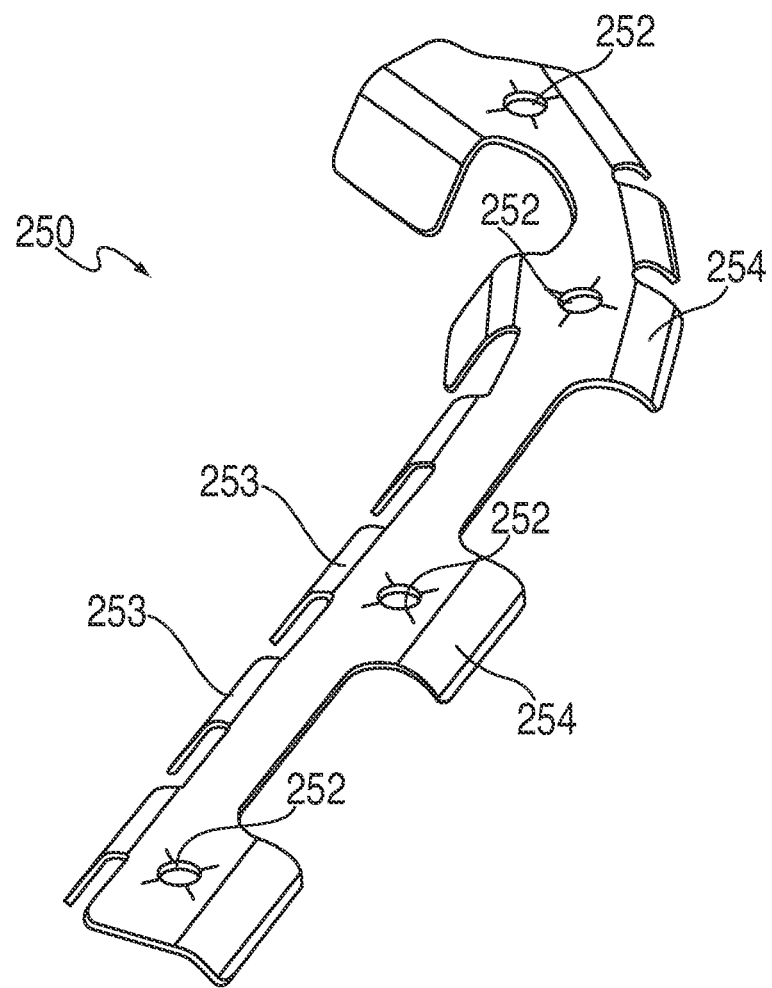
FIG. 2B is a schematic view of a spring for simultaneously grounding an antenna board, a bezel and a housing of an electronic device in accordance with on embodiment of this invention.

To improve the antenna performance (e.g., RF performance and RF consistency), antenna board 260 may be grounded simultaneously to bezel 230 and to housing 210 using grounding spring 250. FIG. 2B is a schematic view of a spring for simultaneously grounding an antenna board, a bezel and a housing of an electronic device in accordance with on embodiment of this invention. Spring 250 may include base 251 operative to rest on wall 236 of bezel 230. In some embodiments, base 251 may operative to rest on a portion of wall 236 that curves (e.g., at a corner of bezel 230), and thus base 251 may be curved to follow the curvature of wall 236. Base 251 may include several apertures 252 operative to receive posts 238 of bezel 230. By placing posts 238 in apertures 252, spring 250 may be easily and consistently mounted to a proper position on walls 236. Once mounted on walls 236, spring 250 may ground bezel 230. In some embodiments, spring 250 may include a double armed flexure (e.g., U-shaped) connected to bezel 230 at a discrete point.

Spring 250 may include several inner tabs 253 extending from base 251 (e.g., six inner tabs 253). Inner tabs 253 may extend out of the plane of base 251 to follow the curvature and inner side of walls 236. The length of inner tabs 253 may be selected to reach antenna board 260 when electronic device 200 is assembled. In some embodiments, inner tabs 253 may be a small amount longer than necessary to reach antenna board 260 so that when the electronic device is assembled, tabs 253 are deformed slightly and press against antenna board 260. This may allow tabs 253 to remain in contact and ground antenna board 260, even when electronic device 200 is subject to drops or other impacts. The flexure in tabs 253 may allow spring 250 to provide tolerant interface between bezel 230 and antenna board 260.

Spring 250 may include several outer tabs 254 (e.g., five outer tabs 254) extending from the opposite side of base 251 as inner tabs 253. Outer tabs 254 may extend out of the plane of base 251 and follow the curvature and outer side of walls 236. The thickness of outer tabs 254 and the distance between the outer surface of wall 236 and outer surface 232 of bezel 230 may be selected such that the inner surface of housing 210 is in contact with at least one outer tab 254 when housing 210 is coupled to bezel 230. For example, outer tabs 254 may be constructed such that outer tabs 254 are maintained between bezel 230 and housing 210 in a press fit.

Spring 250 may be manufactured from any suitable material and using any suitable process. For example, spring 250 may be manufactured from a metal (e.g., copper, gold, or stainless steel), a composite material, flex, or any other suitable material that is electrically conductive. Spring 250 may be manufactured using any suitable approach, including for example forming, forging, machining, molding, stamping, combinations thereof, or any other suitable manufacturing process (e.g., stamping followed by forming).

Figure 3A:
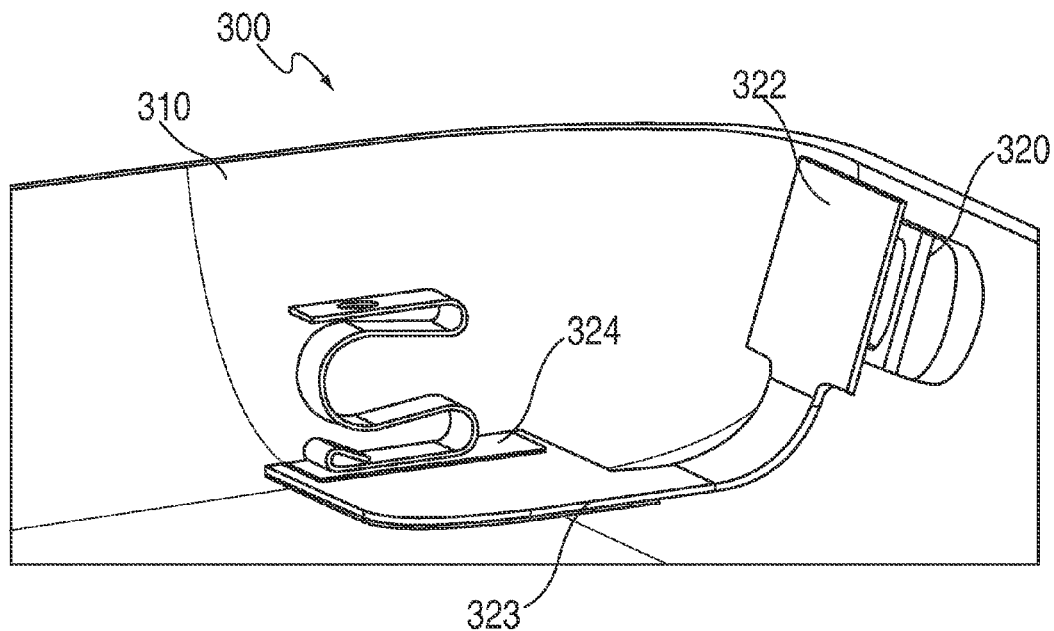
FIG. 3A is a schematic view of an illustrative electronic device having a button in accordance with one embodiment of the invention.
Figure 3B:
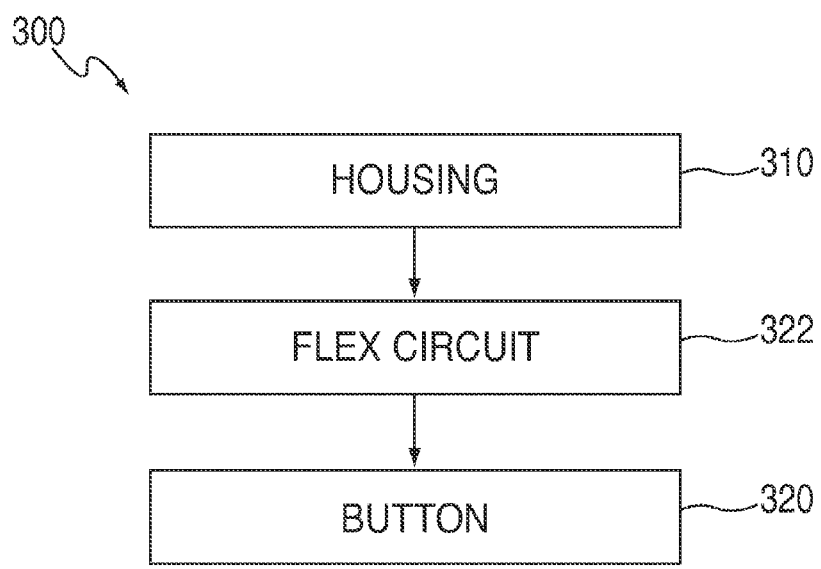
FIG. 3B is a schematic view of a block diagram depicting the electrical connections shown in FIG. 3A in accordance with one embodiment of the invention.

In some embodiments, the housing may include a button that is electrically coupled to the circuit boards of the electronic device. FIG. 3A is a schematic view of an illustrative electronic device having a button in accordance with one embodiment of the invention. FIG. 3B is a schematic view of a block diagram depicting the electrical connections shown in FIG. 3A in accordance with one embodiment of the invention. Electronic device 300 may include housing 310 and button 320. Button 320 may be coupled to the circuit boards of the electronic device (not shown) using flex circuit 322. Flex circuit 322 may include bottom contact pad 323, which may connect flex circuit 322 to housing 310 (e.g., using an electrically conductive adhesive). Flex circuit 322 may also include top contact pad 324, which may be coupled to spring 330, which may in turn be coupled to the main circuit boards of the electronic device (e.g., not shown). Spring 330 and top contact pad 324 may serve as an electrical connection between the circuit board and button 320. Because housing 310 may be electrically conductive (e.g., metallic) and electrically coupled to the bezel (e.g., also metallic), connecting button 320 (e.g., flex circuit 322) to housing 310 using bottom contact pad 323 may suffice to ground button 320. By using housing 310 to ground button 320, a second connection between top flex pad 324 and the circuit board may not be necessary, which may save significant space in electronic device electronic device 300.

Figure 4:
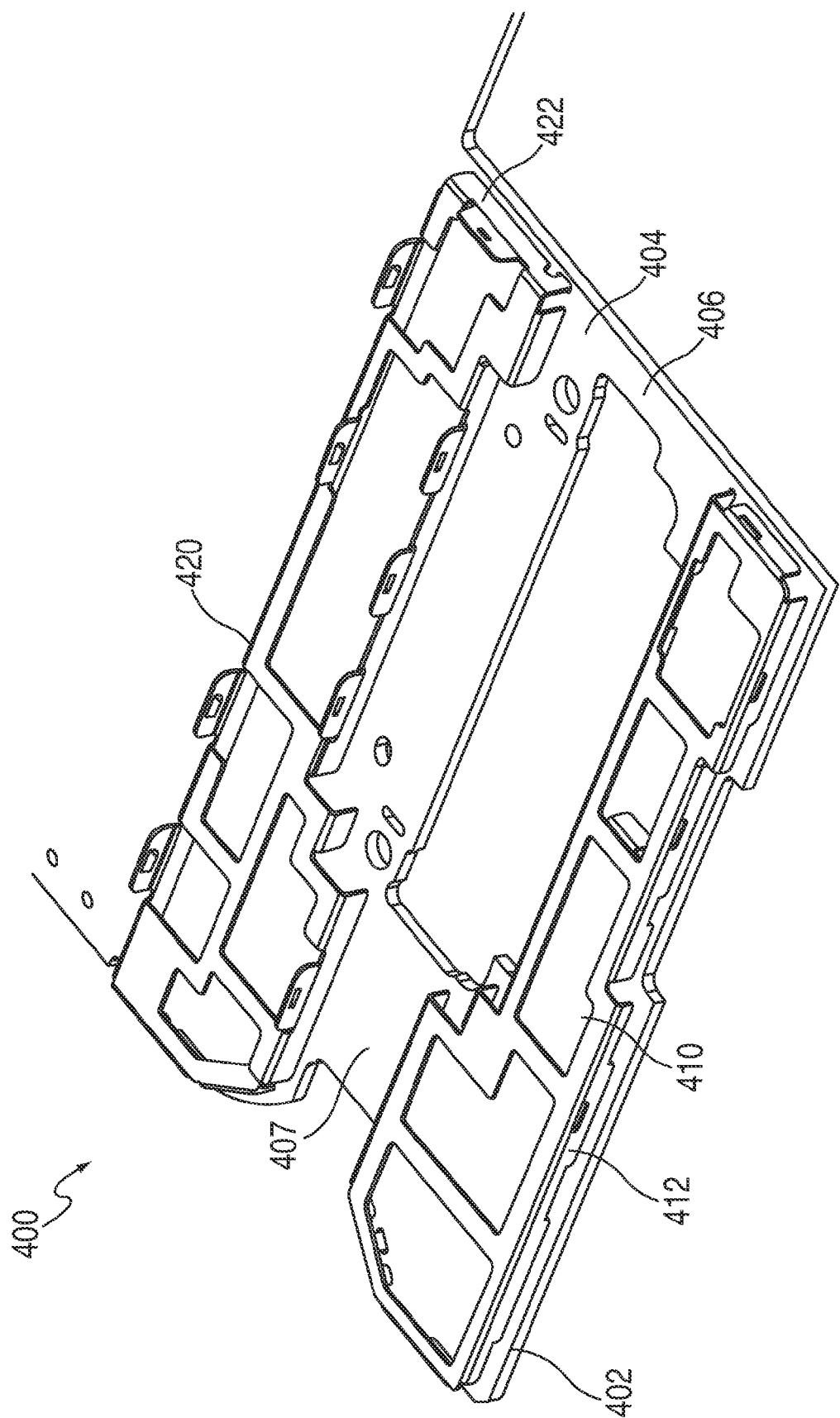
FIG. 4 is a schematic view of a circuit board with fences used to protect circuit board components in accordance with one embodiment of the invention

Because the electronic device may include an antenna for wireless communications (e.g., over an RF communications link), other components of the electronic device, including for example circuit boards, may need to be shielded from RF waves. FIG. 4 is a schematic view of a circuit board with fences used to protect circuit board components in accordance with one embodiment of the invention. Circuit board 400 may include rigid first board 402 and rigid second board 404 coupled by flex tabs 406 and 407. Flex tabs 406 and 407 may be constructed from a supple material operative to bend to allow first board 402 to be placed over second board 404 to reduce the footprint of circuit board 400. In some embodiments, at least one of flex tabs 406 and 407 may be electrically coupled to both first board 402 and second board 404 to ensure that the components of each board can communicate with each other. For example, flex tabs 406 and 407 may be part of a flex circuit integrated in circuit board 400.

The components of each of boards 402 and 404 may be surrounded by fences 410 and 420, respectively. Fences 410 and 420 may define periphery in which components are placed in boards 402 and 404. Fences 410 and 420 may be coupled to boards 402 and 404, respectively, using any suitable approach. For example, fences 410 and 420 may be coupled to boards 402 and 404 using an adhesive, tape, soldering, welding, a mechanical fastener (e.g., a screw), a press fit, or any other suitable approach. In some embodiments, fences 410 and 420 may not be electrically coupled to boards 402 and 404. Fences 410 and 420 may include walls 412 and 422, respectively, which may extend substantially perpendicularly from the surface of each of boards 402 and 404, and have a height substantially equal to or larger than the height of the components (e.g., chips) of each of boards 402 and 404. Walls 412 and 422 may extend substantially around the entire periphery of each of boards 410 and 420 to act as a shield against RF radiation emanating from the antenna that would reach the components of boards 402 and 404 from the side. Walls 412 and 414 may therefore be constructed from any suitable material operative to substantially prevent RF radiation from passing through (e.g., a metal).

Figure 5:
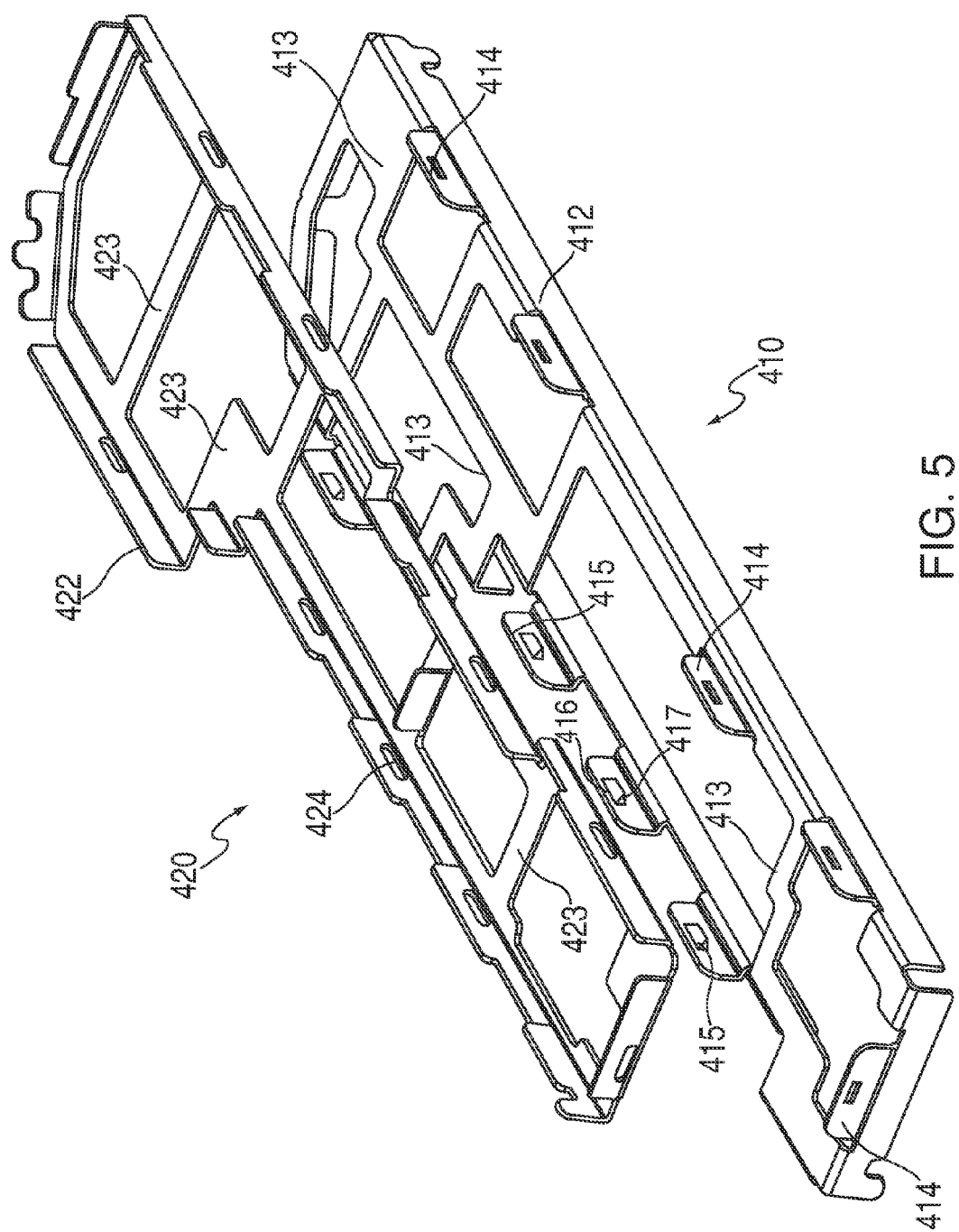
FIG. 5 is a schematic view of fences of the first and second boards of FIG. 4 when they are approached to be engaged in accordance with one embodiment of the invention.

To protect the components of boards 402 and 404 from RF radiation coming from above boards 402 and 404 (e.g., over walls 412 and 422), boards 402 and 404 may be folded over each other such that boards 402 and 404 form the top and bottom shields of the components of boards 402 and 404. Any suitable approach may be used to hold boards 402 and 404 in their bent position. In some embodiments, fences 410 and 420 may be coupled using snaps, detents, catches, flexures, friction couplings, or any other suitable approach. FIG. 5 is a schematic view of fences of the first and second boards of FIG. 4 when they are approached to be engaged in accordance with one embodiment of the invention. Each of fences 410 and 420 may include several cross-bars 413 and 423, respectively, for providing additional structure and rigidity to walls 412 and 422. Cross-bars 413 and 423 be in any suitable shape, including for example straight bars, curved bars, or bars with shapes (e.g., S- or J-shapes). In some embodiments, some of cross-bars 413 and 423 may be spaced in fences 410 and 420 such that when fences 410 and 420 are engaged, cross-bars 413 and 423 are aligned. Cross-bars 413 and 423 may have any suitable width, including for example different widths in a particular fence 410 or 420. In some embodiments, cross-bars 413 and 423 that are aligned may have substantially the same shape and width.

Any suitable approach may be used to engage fences 410 and 420. For example, fences 410 and 420 may be coupled using an adhesive, hook and fastener material (e.g., Velcro®), a mechanical fastener (e.g., a screw), or mechanical components of fences 410 and 420. In some embodiments, fence 410 may include several tabs 414 extending beyond portions of wall 412 such that tabs 414 fit around portions of wall 422 when fence 410 engages fence 420. Fence 410 may include any suitable number of tabs 414 placed at any suitable intervals around the periphery of fence 410. For example, fence 410 may include nine tabs 414, four on each of the elongated sides of fence 410, and one on a short side of fence 410. Each tab 414 may include a snap 415 extending from tab 414 towards the inside of the perimeter defined by wall 412. Snaps 415 may include an angled top surface 416 operative to allow walls 422 of fence 420 to slide past tabs 414 when fences 410 and 420 are engaged, and flat surface 417 operative to engage walls 422 to maintain fence 420 against fence 410.

Figure 6:
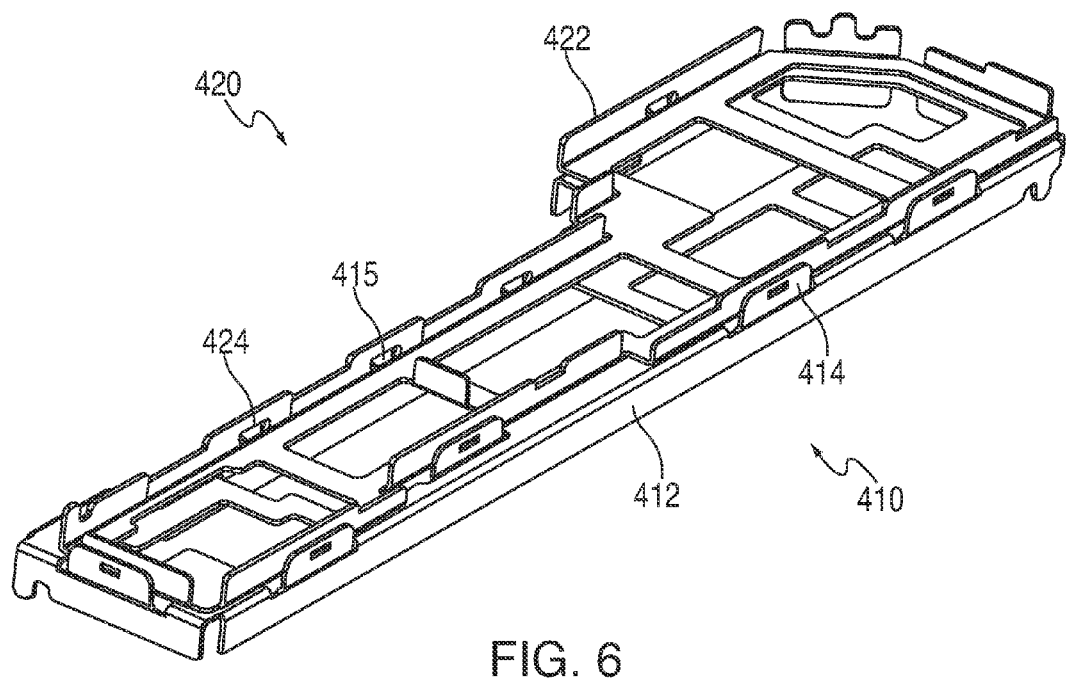
FIG. 6 is a schematic view of the fences of the first and second boards of FIG. 5 when they are engaged in accordance with one embodiment of the invention.

Snaps 415 may be operative to engage slots 424 of walls 422. Slots 424 may be constructed in walls 422 such that, when fences 410 and 420 are engaged, snaps 415 are aligned with slots 422. Walls 422 may include any suitable number of slots 422, including for example as many slots 422 as snaps 415 in tabs 414. Slots 424 may take any suitable form, including for example apertures in walls 424, notches (e.g., that do not extend all the way through walls 424), protrusions extending from walls 424 operative to engage snaps 415, or any other suitable form. FIG. 6 is a schematic view of the fences of the first and second boards of FIG. 5 when they are engaged in accordance with one embodiment of the invention. When fence 420 is placed over fence 410, tabs 414 may be elastically bent outwards to allow walls 422 to pass before returning to its initial shape when snaps 415 engage slots 424. If slots 424 are apertures, snaps 415 may be visible through walls 422 when fences 410 and 420 are engaged.

Figure 7:
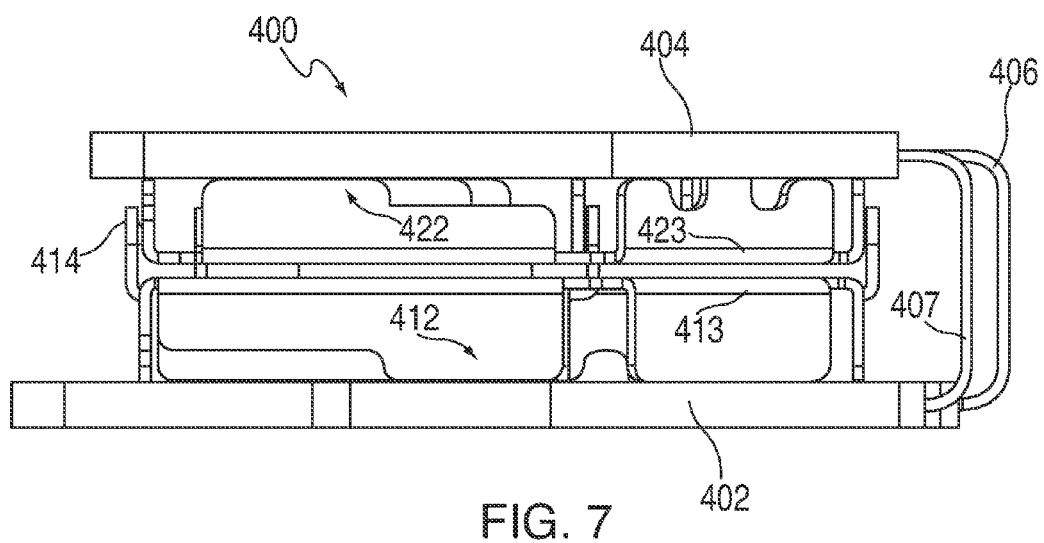
FIG. 7 is a cross-sectional view of the board of FIG. 4 when the board is folded in accordance with one embodiment of the invention.
Figure 8:
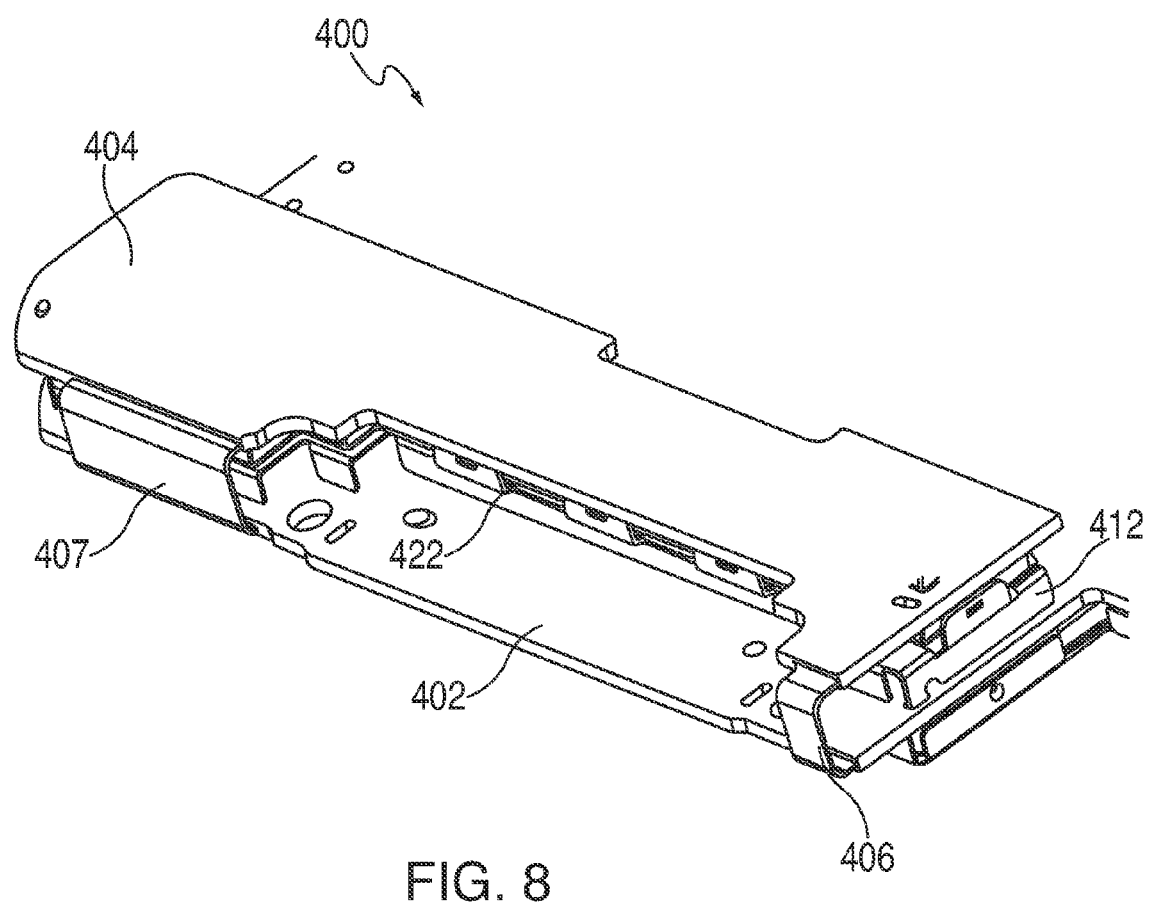
FIG. 8 is a schematic view of the board of FIG. 4 when the board is folded in accordance with one embodiment of the invention.

FIG. 7 is a cross-sectional view of the board of FIG. 4 when the board is folded in accordance with one embodiment of the invention. FIG. 8 is a schematic view of the board of FIG. 4 when the board is folded in accordance with one embodiment of the invention. To prevent RF radiation from accessing board components by passing in between fences 410 and 420 when fences 410 and 420 are engaged, the positions of snaps 415 and slots 424 (e.g., the height of snaps 415 relative to the height of walls 412, and the height of slots 424 relative board 404) may be selected such that fences 410 and 420 are substantially in contact or nearly in contact when engaged. In some embodiments, cross-bars 413 and 423 may be substantially in contact or nearly in contact to further engage fence 410 to fence 420. For example, cross-bars 413 and 423 may be coupled (e.g., using an adhesive, a mechanical fastener, or components implemented on the cross-bars, such as snaps). As shown in FIG. 7, cross-bars 413 and 414 may be nearly in contact.

Once boards 402 and 404 are folded over each other and set in place by the engagement of fences 410 and 420, the circuit board components of boards 402 and 404 may be protected from RF radiation from all directions. Walls 412 and 422 may prevent radiation from reaching the circuit board components from the side, and boards 402 and 404 may prevent radiation from reach the circuit board components from the bottom and top, respectively. Thus, the components of circuit board 400 may be protected from RF radiation without surrounding circuit board 400 with an additional entire box to protect the circuit board components from RF radiation, which may take up a significant amount of space in an electronic device that has only a limited amount of space available. In some embodiments, walls 412 and 422 may form a complete wall from a combination of portions (e.g., castleated alternating high and low portions) combining to form a continuous wall. In some embodiments, walls 412 and 422 may instead or in addition overlap to form a redundant wall when they come together.

Although only one flex tab 406 or 407 may be needed to provide an electrical coupling between boards 402 and 404, circuit board 400 may include at least two flex tabs 406 and 407 connecting boards 402 and 404 to limit torsion stresses as first board 402 is folded over second board 404. For example, circuit board 400 may include flex tab 406 at one end boards 402 and 404, and flex tab 407 at an opposite end of boards 402 and 404. Flex tabs 406 and 407 may have any suitable width, including different widths (e.g., a smaller width for the flex tab that is not used as a conductive path between boards 402 and 404). The widths of each of flex tabs 406 and 407 may be selected such that torsion stresses are minimized (e.g., due to the presence of both tabs opposing bending moments) using the least amount of material necessary (e.g., to reduce cost, weight, and space used in the electronic device). In some embodiments, board 400 may include more than two flex tabs, or one large flex tab spanning the entire or substantially the entire length of boards 402 and 404 to provide stiffness against torsion.

Figure 9:
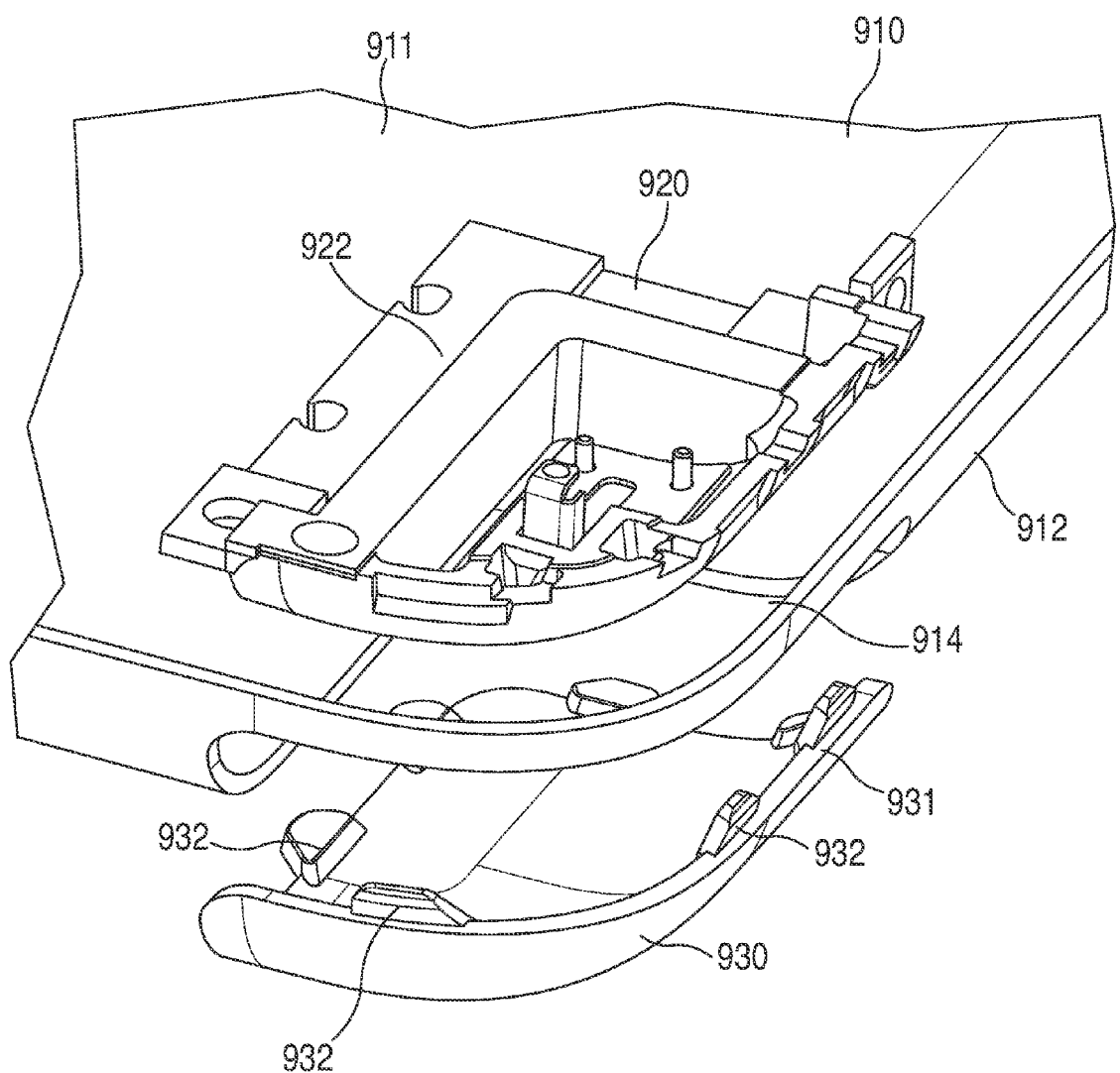
FIG. 9 is a schematic view of an electronic device housing in accordance with one embodiment of the invention.

FIG. 9 is a schematic view of an electronic device housing in accordance with one embodiment of the invention. Housing 910 may include aperture 914 for receiving the antenna assembly. Aperture 914 may be carved out of a curved surface of housing 910, including for example part of rear plate 911 and one or more walls 912 (e.g., from a corner of housing 910). Aperture 914 may be manufactured using any suitable approach. In some embodiments, aperture 914 may be manufactured as a feature of housing 910 when housing 910 is manufactured (e.g., aperture 914 is included in a stamp used to form housing 910). In some embodiments, aperture 914 may be cut into housing 910 once its shape been substantially defined.

Aperture 914 may be cut in housing 910 using any suitable approach. In some embodiments, aperture 914 may be created using punching, beam cutting (e.g., using a laser beam or a high pressure water beam), or any other suitable approach. By using beam cutting, aperture 914 may be precisely cut to enhance the fit of antenna cap 930 in aperture 914. In some embodiments, aperture 914 may be cut such that the walls of aperture 914 are all perpendicular to the surface of housing 910. When aperture 914 is cut from a curved portion of housing 910 (e.g., the corner of housing 910), one of the cutting beam or housing 910 may move to ensure that all cuts remain perpendicular to outer surface of housing 910. For example, the cutting beam may be a laser cutter controlled on 2 axes, and housing 910 may be placed in a fixture operative to move along the last axis. Thus, the cutting beam may perform incisions in housing 910 as if it were a cutting beam controlled on 3 axes.

In some embodiments, the cutting beam may cut aperture 914 in a single, continuous cut. This may allow for a cleaner and more precise overall cut, and a faster manufacturing process. Once the cutting beam cuts aperture 914, the edge of aperture 914 may be cleaned ultrasonically and/or tumbled to remove any extraneous material. This process may allow for a very tight reveal by which antenna cap 930 may mate tightly with aperture 914 to provide a flush outer surface for the electronic device.

Antenna assembly 920 may include antenna chassis 922 operative to receive an antenna, and antenna cap 930 operative to provide a radio-transparent cosmetic outer surface for antenna assembly 920. Antenna chassis 922 may be mounted to the inner surface of housing 910 or of the bezel (e.g., bezel 230, FIG. 2A) using any suitable approach, including for example an adhesive, a mechanical fastener, a mechanical component built in housing 910 and/or antenna chassis 922 (e.g., a pin), or any other suitable approach. The shape of antenna chassis 922 may be specifically designed to maximize the antenna performance for wireless communications operations. Accordingly, it may be desirable to introduce a separate component to provide the cosmetic cover of chassis 922 to limit the constraints on chassis 922.

Contrary to antenna chassis 922, antenna cap 930 may be coupled to housing 910 from the outside of the housing. For example, antenna cap 930 may be manufactured such that the outer periphery 931 of cap 930 matches the periphery of aperture 914 and provides a press fit between cap 930 and aperture 914. In some embodiments, cap 930 may include several tabs 932 extending from the edge of the inner surface of cap 930. Tabs 932 may be operative to reach into the inner surface of housing 910 when cap 930 is mounted in aperture 914. Cap 930 may include any suitable number of tabs, including for example one or two per side of cap 930 (e.g., 7 total tabs).

To mount cap 930 to housing 910, cap 930 may be elastically deformed to fit into aperture 914 from the outside of housing 910 (e.g., instead of being placed in aperture 914 from the inside of housing 910). For example, the outer edges of cap 930 (e.g., around tabs 932) may be deformed as cap 930 is forced into aperture 914. Once cap 930 is within the boundaries defined by aperture 914, cap 930 may return to its initial shape and be flush with housing 910. Tabs 932 may prevent cap 930 from moving out of aperture 914, while the contact between curved periphery 931 of cap 930 and the edge of aperture 914 may prevent cap 930 from moving into housing 910. The thickness and shape of cap 930 may be selected such that, once inserted in aperture 914, cap 930 is flush with the outer surface of housing 910. Once cap 930 is inserted in housing 910, antenna chassis 922 may be mounted in the electronic device.

Antenna cap 930 may be manufactured using any suitable approach. In some embodiments, antenna chassis 922 and cap 930 may be manufactured from plastic, foam, or any other material that may allow radiation to pass through electronic device 900. In some embodiments, cap 930 may be manufactured using a molding process that includes forced ejection of the cap. For example, because tabs 932 may extend beyond the periphery of cap 930, cap 930 may be forcibly ejected in a manner that causes tabs 932 to deform elastically. In some embodiments, the manufacturing process may include several ejections. For example, first a moon gate runner may be ejected by an ejector pin to avoid the gate breaking in the sub-insert. Second, a stripper plate and ejector bar may be ejected to create space for the tabs to flex. Third, the ejector bar may be raised to eject the part from the undercut (e.g., while elastically deforming the tabs).

Antenna chassis 922 and antenna cap 930 may be formed from any material suitable for allowing electromagnetic waves (e.g., from the antenna) to pass. For example, antenna chassis 922 may be formed from a porous material that has low density, low dielectric, and low loss tangent, while still providing sufficient stiffness. It may be important to select such materials to enhance the antenna performance because the housing and bezel of the electronic device may be manufactured from metals, which may significantly reduce antenna performance. Suitable materials for antenna chassis 922 may include, for example, low density plastic such as polycarbonate (e.g., which may have a dielectric of 3) and foam (e.g., which may have a dielectric of 1.1). For example, a cast foam piece (e.g., two part epoxy expanding into mold) may provide a strong material that may be attached using means typically used for plastic components (e.g., using mechanical fasteners). To add an antenna to an antenna chassis 922 manufactured from foam, the antenna may be weaved into the chassis. In some embodiments, the antenna may be molded into an antenna chassis 922 manufactured from foam (e.g., place antenna inside foam chassis mold), which may protect the antenna from mechanical damage (e.g., during manufacturing of the electronic device) and from rusting (e.g., insert molding technique).

A foam antenna chassis may be manufactured using any suitable approach. For example, the foam chassis may be cast, machined, stamped, molded, combinations of these, or any other suitable approach. The cast foam may be sufficiently stiff to support mechanical components (e.g., pins or snaps), or receive mechanical fasteners (e.g., a screw).

Figure 10:
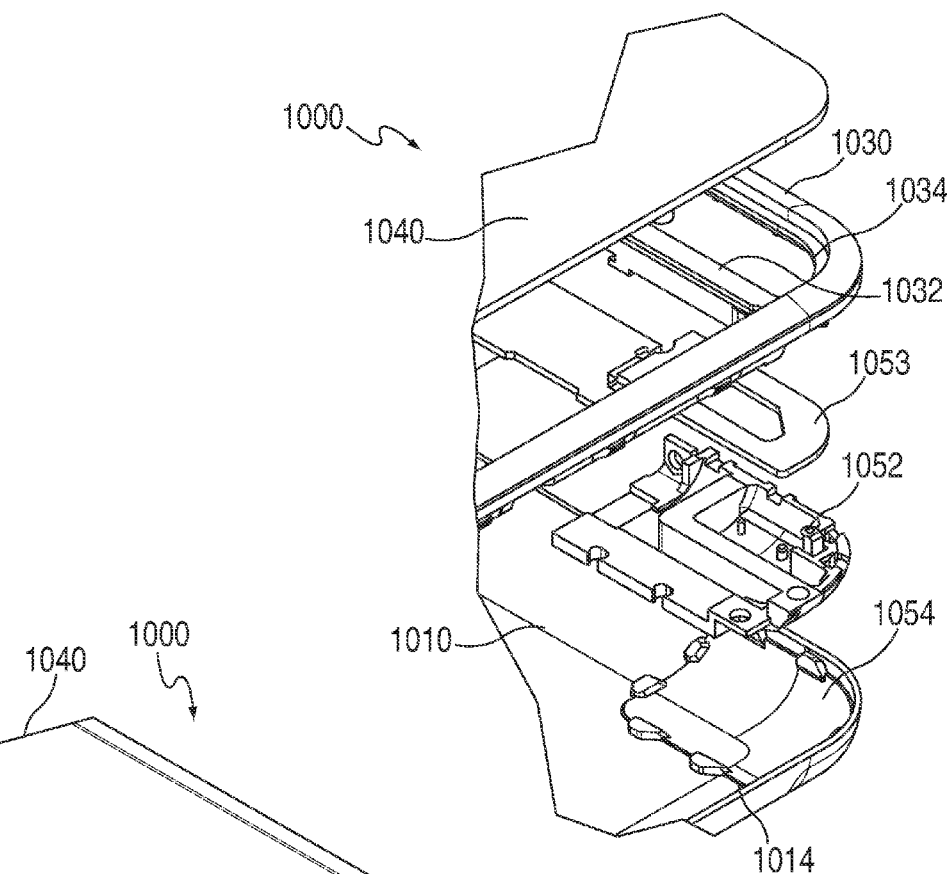
FIG. 10 is an exploded view of an electronic device having an antenna assembly operative to transmit RF waves through the front of the electronic device in accordance with one embodiment of the invention.
Figure 11:
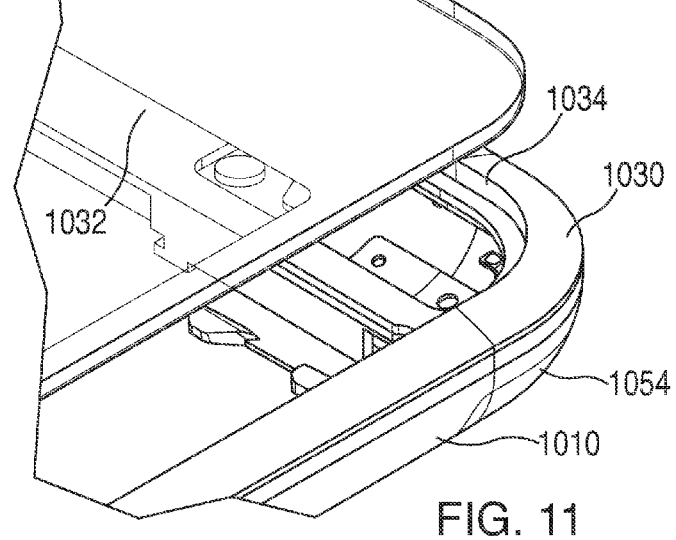
FIG. 11 is a schematic view of the electronic device of FIG. 10 when it is partially assembled.

In some embodiments, RF waves transmitted by the antenna may pass through the back of the electronic device, that is the housing (e.g., through cap 930), or through the front of the electronic device, that is the bezel and screen. FIG. 10 is an exploded view of an electronic device having an antenna assembly operative to transmit RF waves through the front of the electronic device in accordance with one embodiment of the invention. FIG. 11 is a schematic view of the electronic device of FIG. 10 when it is partially assembled. Electronic device 1000 may include housing 1010, bezel 1030 and window 1040. Housing 1010 may include aperture 1014 for receiving antenna cap 1054. Electronic device 1000 may include antenna chassis 1052 and antenna board 1053, which may include an antenna for allowing the electronic device of electronic device 1000 to perform wireless communications operations.

Bezel 1030 may include beam 1032 extending across the width of bezel 1030. In some embodiments, beam 1032 may extend substantially across the surface of antenna chassis 1052. Because bezel 1030 may be metallic, and thus prevent RF radiation from the antenna from passing through its surface, beam 1032 may include aperture 1034 through which RF radiation may pass. Aperture 1034 may be any suitable size, including for example substantially the size of antenna chassis 1052. In addition, aperture 1034 may be positioned in beam 1032 such that aperture 1034 is substantially aligned with the antenna. In some embodiments, antenna board 1053 may also include a window to allow an antenna mounted on antenna chassis 1052 to transmit RF radiation through the top surface of the electronic device.

Figure 12:
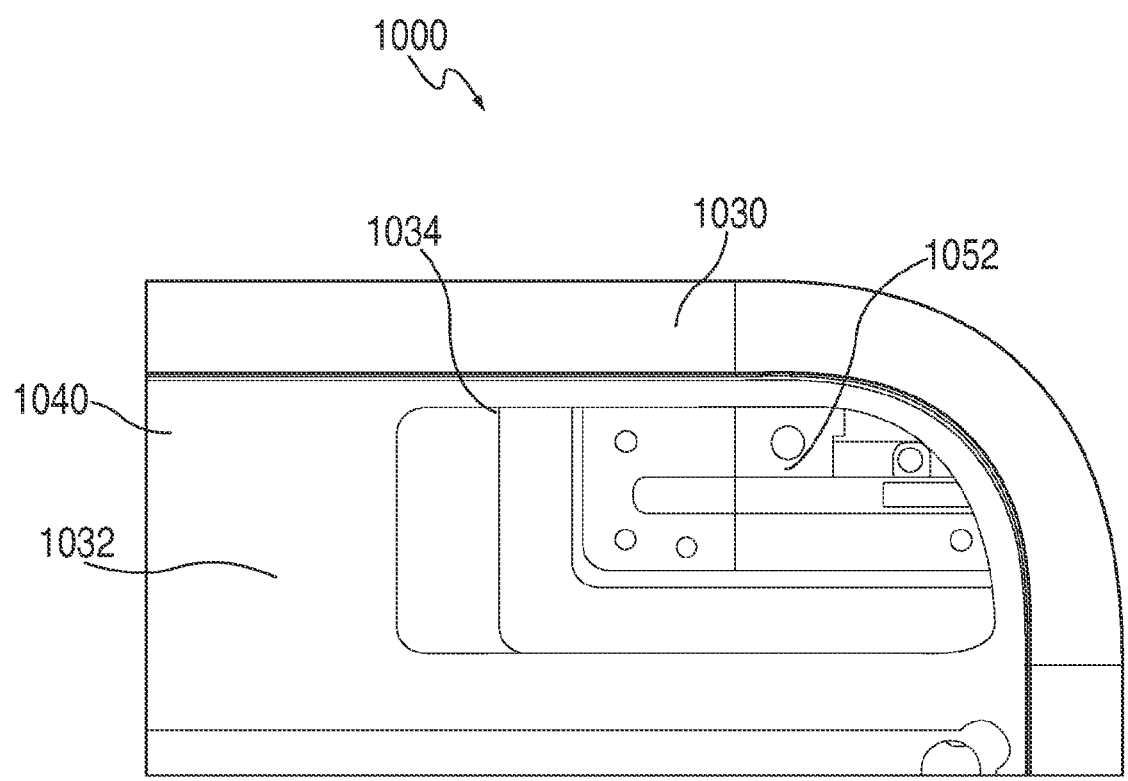
FIG. 12 is a top view of the assembled electronic device of FIG. 10 in accordance with one embodiment of the invention.

Window 1040 may be placed over bezel 1030 and beam 1032 such that aperture 1034 is under window 1040. FIG. 12 is a top view of the assembled electronic device of FIG. 10 in accordance with one embodiment of the invention. Window 1040 may be operative to protect the antenna from impacts or prevent undesired particles from passing through aperture 1034. To hide aperture 1034 and antenna chassis 1052 from view (e.g., prevent aperture 1034 and antenna chassis 1052 from being visible through window 1040, as shown in FIG. 12), a portion of window 1040 may be coated with an opaque layer (e.g., a black layer). RF radiation may continue to pass through the opaque layer, but visible light may be blocked.

Figure 13:
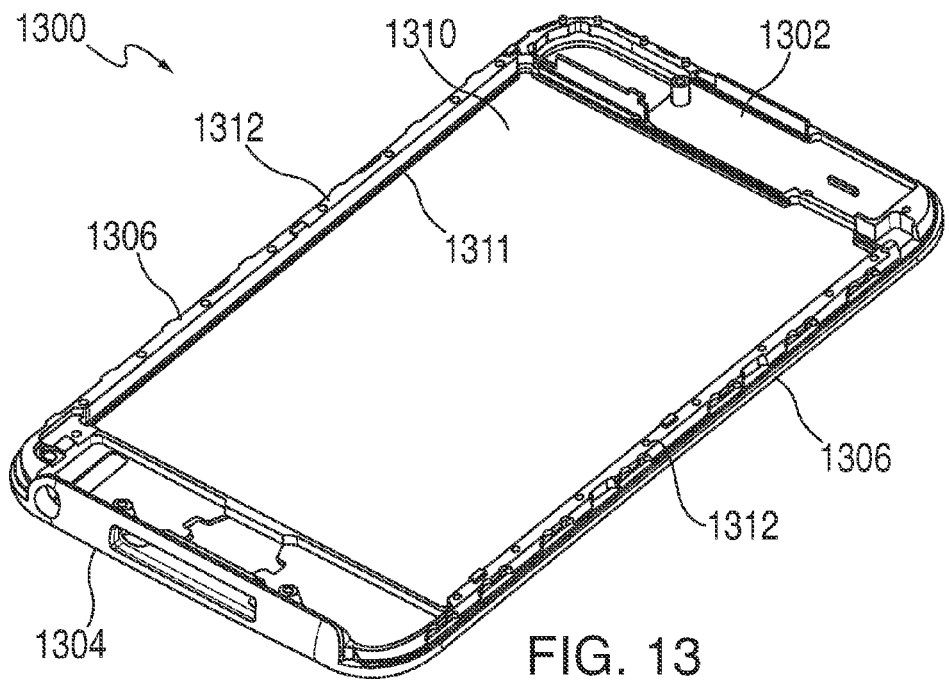
FIG. 13 is a schematic view of a bezel in accordance with one embodiment of the invention.

The outer periphery of the electronic device may be defined by a bezel coupled to a housing. The bezel may include an opening for receiving a window providing displays to a user. FIG. 13 is a schematic view of a bezel in accordance with one embodiment of the invention. Bezel 1300 may include top end 1302, bottom end 1304 and sides 1306. Bezel 1300 may include large aperture 1310 defined by ends 1302 and 1304 and sides 1306 for receiving an electronic device screen. In some embodiments, bezel 1300 may include flange 1311 operative to engage a portion of the electronic device screen. Because of the relative thinness of ends 1302 and 1304 and sides 1306, bezel 1300 may be strong in bending, but weaker in torsion.

Figure 14:
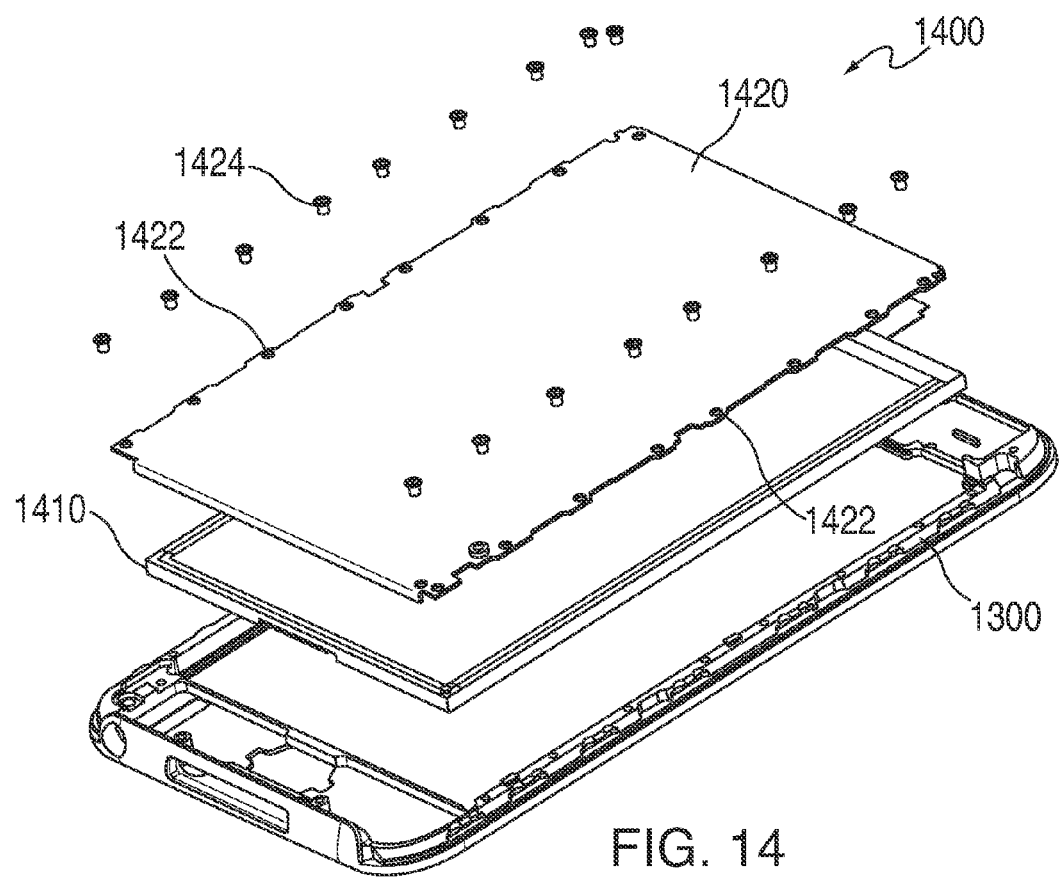
FIG. 14 is an exploded view of the bezel of FIG. 13 with additional components in accordance with one embodiment of the invention.

FIG. 14 is an exploded view of the bezel of FIG. 13 with additional components in accordance with one embodiment of the invention. Electronic device 1400 may include bezel 1300, screen 1410, and plate 1420 for coupling screen 1410 to bezel 1300. Screen 1410 may include any suitable screen for providing a display to a user. For example, screen 1410 may include a liquid crystal display (LCD). Screen 1410 may be operative to be placed in aperture 1310 through the back of bezel 1300 such that at least one edge of screen 1400 abuts a portion of bezel 1300 (e.g., to prevent screen 1400 from passing through aperture 1310).

Plate 1420 may include any suitable plate for supporting screen 1410 in bezel 1300. For example, plate 1420 may be constructed from plastic, composite materials, metal, or any other suitable material. In some embodiments, plate 1420 may be constructed from a material selected so that plate 1420 is strong in torsion, but weaker in bending. Plate 1420 may be any suitable size, including for example substantially the size of aperture 1310, substantially the size of screen 1410, or any other suitable size. Once plate 1420 is coupled to bezel 1300, screen 1410 may be trapped between plate 1420 and the edges of bezel 1300. For example, screen 1410 may be trapped between flange 1311 of bezel 1300 on one side (e.g., the side facing out of the electronic device) and plate 142 on the other side (e.g., the side facing in the electronic device), without being directly coupled to either bezel 1300 or plate 1420. Plate 1420 may be coupled to bezel 1300 using any suitable approach. For example, plate 1420 may be coupled to bezel using an adhesive, tape, a mechanical fastener, a mechanical component (e.g., a pin), or any other suitable approach.

Figure 15:
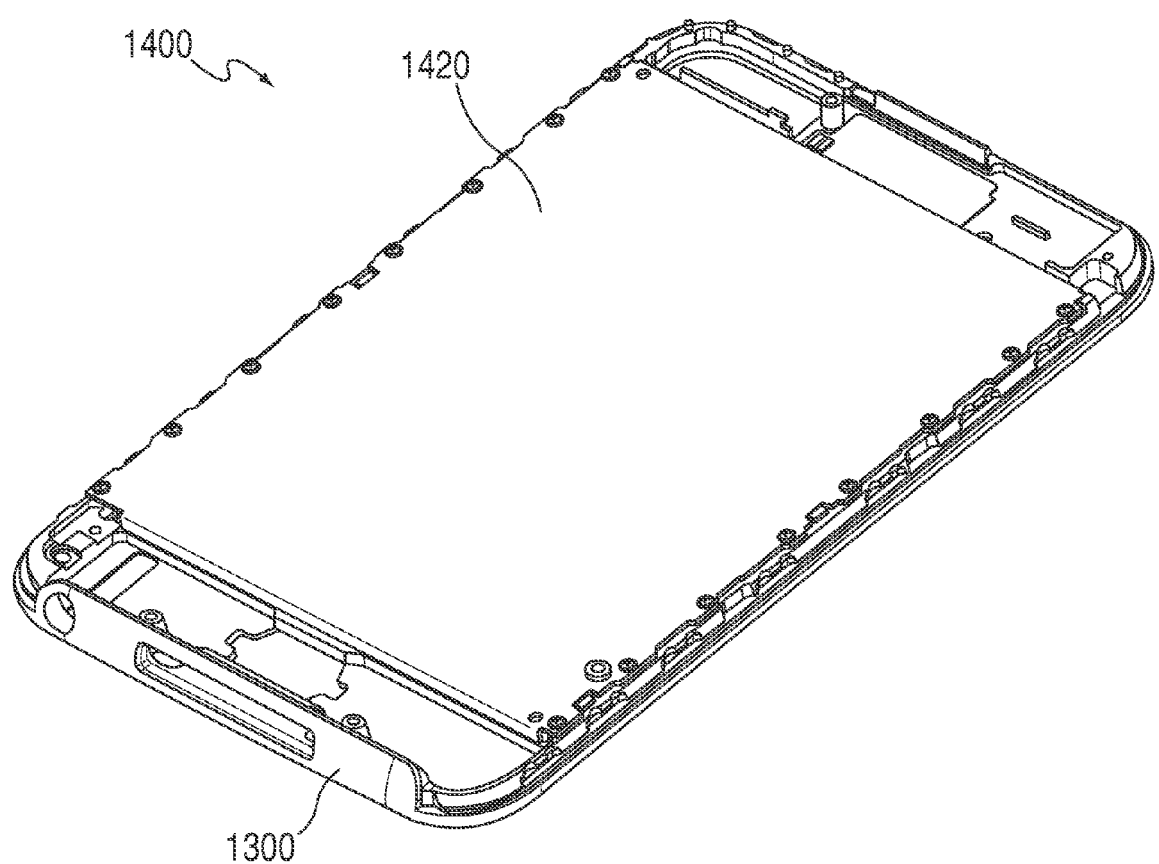
FIG. 15 is a schematic view of the electronic device of FIG. 14 when the electronic device is assembled in accordance with one embodiment of the invention.

In some embodiments, plate 1420 may be coupled to bezel 1300 in a manner that increases the tortional stiffness of the assembly. For example, plate 1420 may be coupled to bezel 1300 using several mechanical fasteners (e.g., screws). To further increase the stiffness of the assembly, more fasteners than are necessary to couple the components to each other may be used. Bezel 1300 may include several screw taps 1312 operative to receive fasteners. Plate 1420 may include several holes 1422 operative to receive fasteners 1424. Electronic device 1400 may include any suitable number of fasteners 1424, including for example eight fasteners 1424 on each side 1306. When fasteners 1424 are tightened, bezel 1300 and plate 1420 may be coupled and form a box-like structure or frame that is strong both in bending and in torsion. FIG. 15 is a schematic view of the electronic device of FIG. 14 when the electronic device is assembled in accordance with one embodiment of the invention. By coupling plate 1420 to bezel 1300, the combined structure may increase the stiffness of screen 1410, and may also increase the overall stiffness of electronic device 1400. In some embodiments, plate 1420 may include one or more structures operative to receive electronic device components (e.g., electronic device components that are to be mounted on a rigid frame, such as for example a battery, a PCB, or a flex). Thus, the electronic device may include a thin assembly that is strong in both torsion and bending constructed from components that separately are not strong in both torsion and bending.

Figure 16:
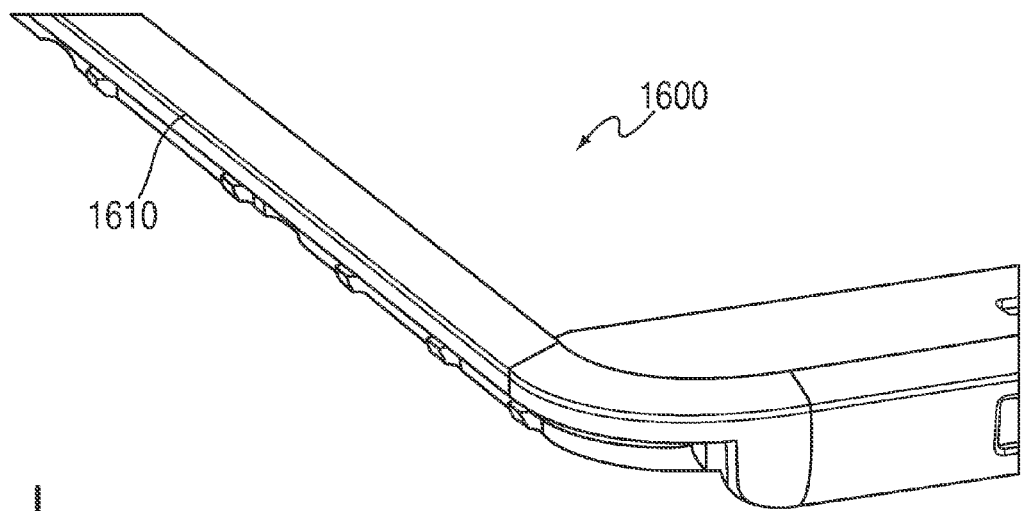
FIGS. 16, 17 and 18 are schematic views of a bezel of an electronic device in accordance with one embodiment of the invention.
Figure 17:
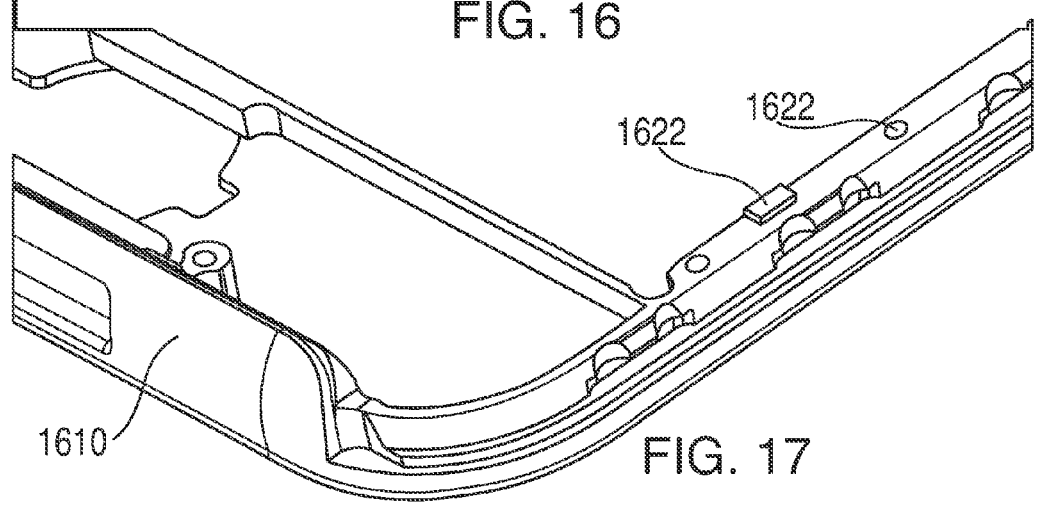
Figure 18:
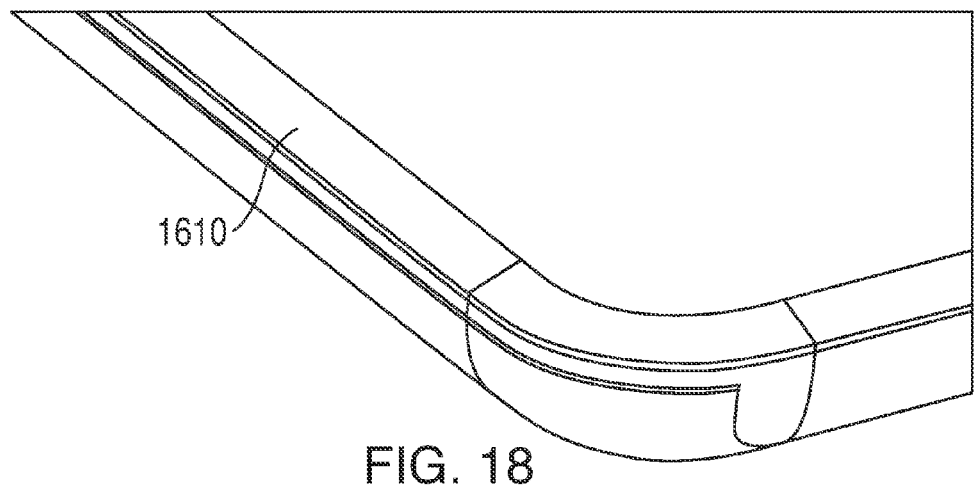

The electronic device bezel may have several functions. For example, one surface of the bezel may be cosmetic (e.g., the outer surface), while another surface of the bezel may be functional (e.g., the inner surface, to which electronic device components may be mounted). This may allow the electronic device to use a single component for both inner mechanical features and outer aesthetic features. FIGS. 16, 17 and 18 are schematic views of a bezel of an electronic device in accordance with one embodiment of the invention. Bezel 1600 may include outer surface 1610, which may be polished, tumbled, or otherwise finished to provide an aesthetically pleasing surface. Bezel 1600 may include inner surface 1620, which may include several structures 1622 operative to receive one or more electronic device components (e.g., a screen, a plate, a circuit board, or a battery). For example, structures 1622 may include posts, pins, snaps, screw taps, apertures, tabs, or any other suitable structure. In some embodiments, all or substantially all of the components of the electronic device may be mounted to bezel 1600.

Figure 19:
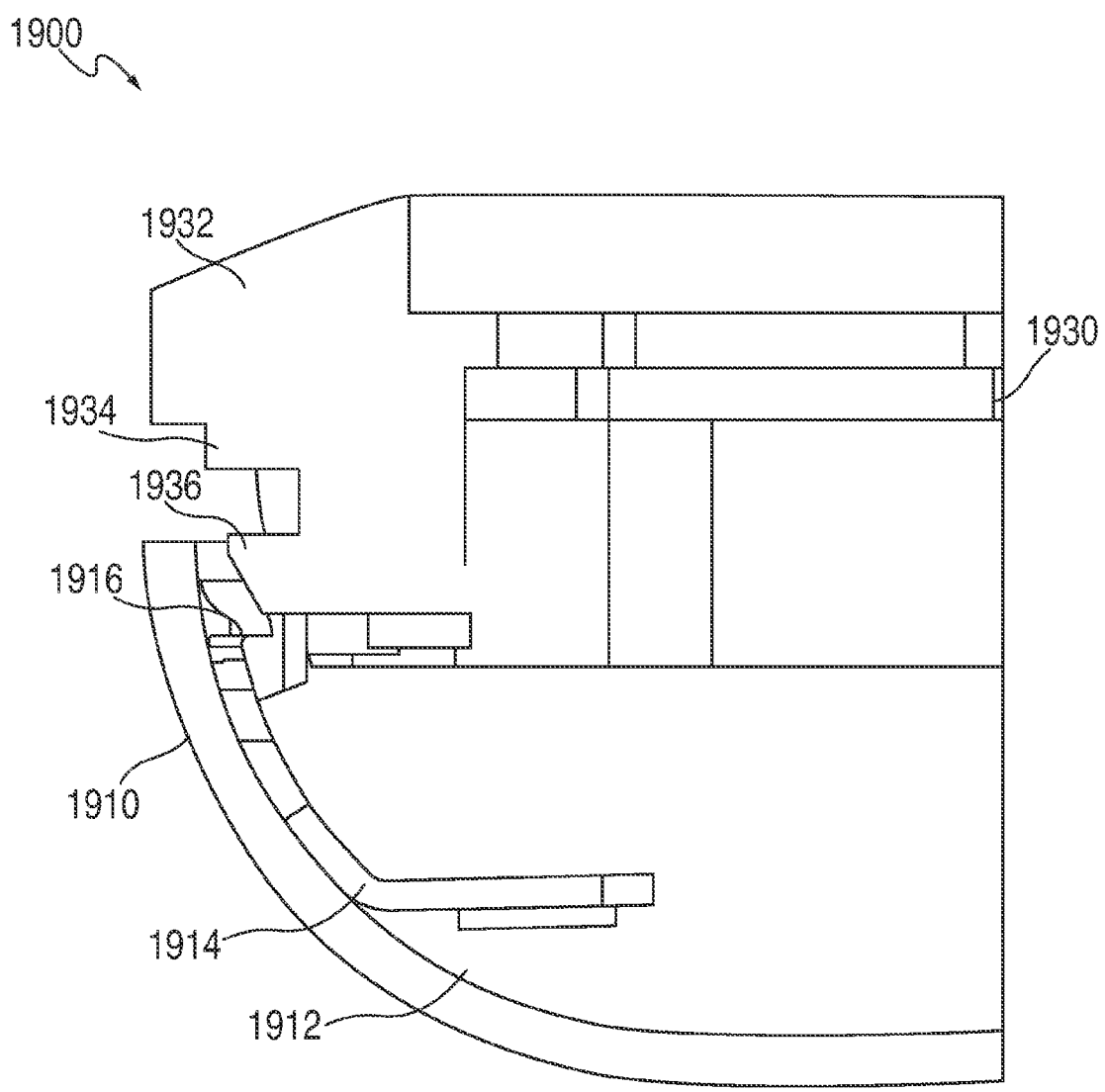
FIG. 19 is a cross-sectional view of an electronic device as a bezel is brought into contact with a housing in accordance with one embodiment of the invention.

The housing may engage the bezel using any suitable approach. FIG. 19 is a cross-sectional view of an electronic device as a bezel is brought into contact with a housing in accordance with one embodiment of the invention. Electronic device 1900 may include housing 1910 and bezel 1930. Bezel 1930 may include outer surface 1932 (e.g., the cosmetic surface) and inner wall 1934. In some embodiments, inner wall 1934 may be recessed from outer surface 1932 to allow bezel 1930 to form a flush fit with housing 1910 when electronic device 1900 is assembled. Inner wall 1934 may include one or more slots 1936 operative to engage housing 1910 to close electronic device 1900.

Housing 1910 may include one or more ramps 1914 operative to be coupled to inner surface 1912 of housing 1910, where each ramp 1914 may include a latch 1916 operative to engage slot 1936 of housing 1930. By placing ramps 1914 on the inner surface of housing 1910, the aesthetic appeal of electronic device 1900 may be retained. Ramps 1914 may be coupled to housing 1910 using any suitable approach, including for example an adhesive, tape, hook and fastener material, a mechanical fastener, welding (e.g., spot welding or laser welding), or any other suitable approach. Ramps 1914 may follow the inner surface of housing 1910 such that ramps 1914 are operative to deflect with housing 1910. Ramps 1914 and slots 1936 may be manufactured such that latches 1916 are aligned with slots 1936 when electronic device 1900 is assembled.

Figure 20:
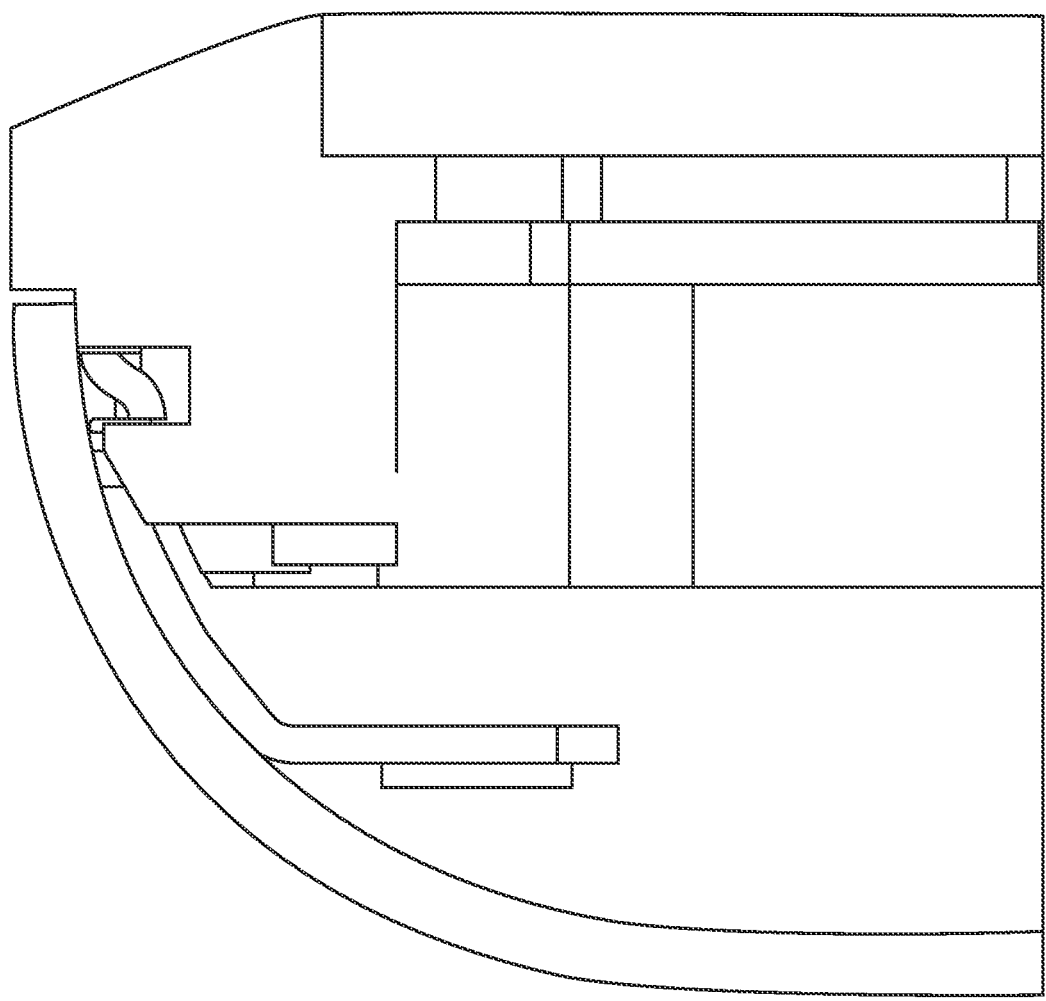
FIG. 20 shows a cross-sectional view of the electronic device of FIG. 19 once the bezel engages the housing in accordance with one embodiment of the invention.

To assemble electronic device 1900, bezel 1930 may be inserted into housing 1910 such that each latch 1916 may engage a slot 1936. As inner wall 1934 passes latches 1916 and ramps 1914, housing 1910 may deform elastically to allow inner wall 1934 to pass. In some embodiments, inner wall 1934 may be too thick or too short to deflect as it passes into housing 1910. As shown in FIG. 19, housing 1910 may be progressively deformed to allow inner wall 1934 to pass (e.g., as compared to the position of housing 1910 in FIG. 20) as it moves over ramp 1914. Once bezel 1930 has been sufficiently inserted into housing 1910, latches 1916 may reach slots 1936 and engage bezel 1930. As latches 1916 engage slots 1936, housing 1910 may return to its initial, un-deformed position. FIG. 20 shows a cross-sectional view of the electronic device of FIG. 19 once the bezel engages the housing in accordance with one embodiment of the invention. Once engaged, the outer surfaces of bezel 1930 and housing 1910 may be substantially flush.

Figure 21:
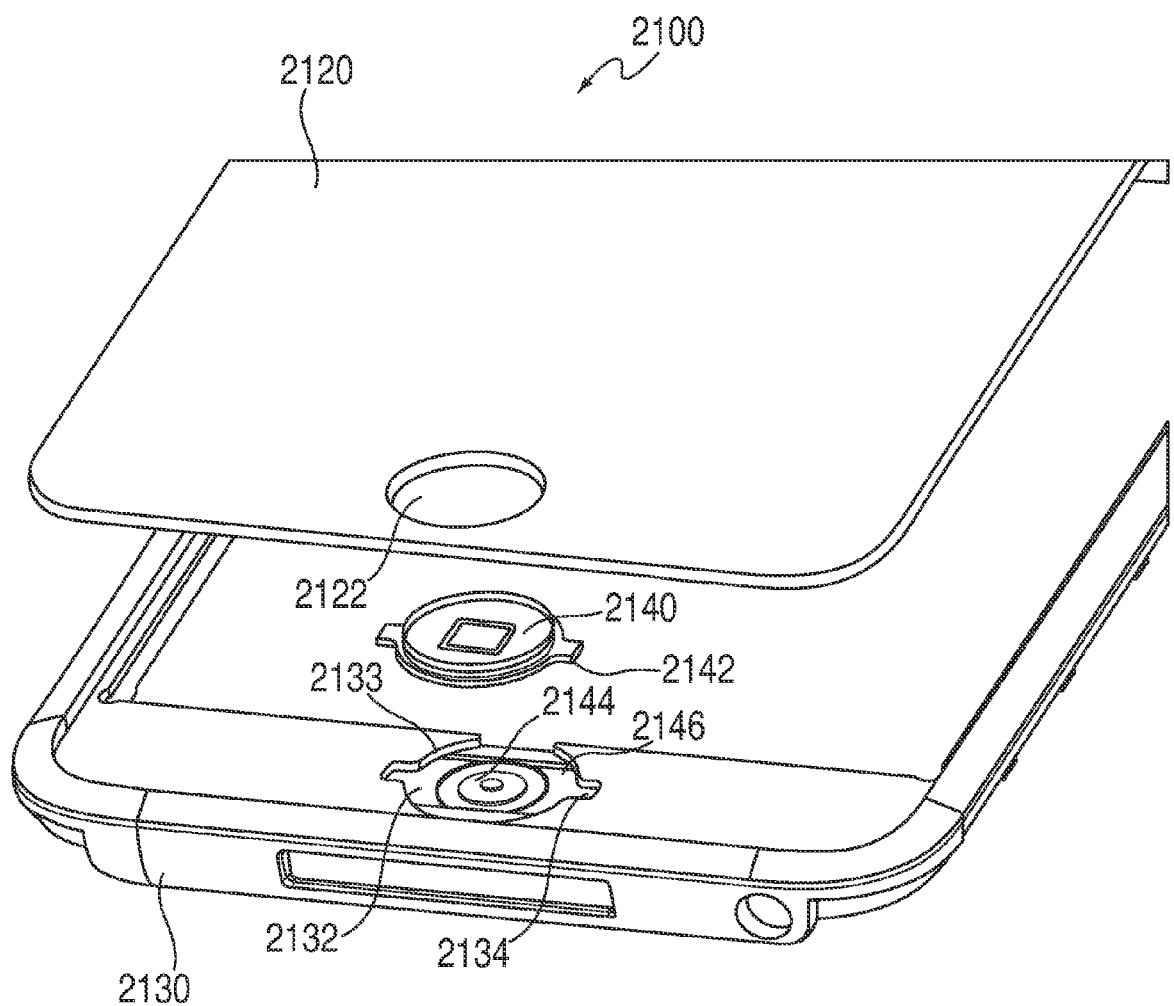
FIG. 21 is an exploded view of an electronic device that includes a home button in accordance with one embodiment of the invention.

The electronic device may have any suitable interface for allowing a user to provide instructions to the electronic device. In some embodiments, the electronic device may include a home button. FIG. 21 is an exploded view of an electronic device that includes a home button in accordance with one embodiment of the invention. Electronic device 2100 may include bezel 2130 and screen 2120. Bezel 2130 may include aperture 2132 operative to receive button 2140. Aperture 2132 may include center hole 2133 and slots 2134 extending from the periphery of hole 2133. Button 2140 may include flanges 2142 extending from the periphery of button 2140. Button 2140 and aperture 2132 may be manufactured such that, when button 2140 is placed in aperture 2132, the center of button 2140 fits in hole 2133 and flanges 2142 are placed in slots 2134. By placing flanges 2142 in slots 2134, button 2140 may be prevented from rotating. In some embodiments, slots 2134 may not extend all the way through the surface of bezel 2130 such that button 2140 may rest on the surface of bezel 2130.

Button 2140 may be captured in bezel 2130 by placing screen 2120 over bezel 2130. Screen 2120 may include hole 2122, which may be substantially the same size as the center of button 2140. Screen 2120 may not include additional openings aligned with the flanges 2142 such that, once screen 2120 is placed over bezel 2130, button 2140 is captured between bezel 2130 and glass 2120 by flanges 2142. In particular, button 2140 may not be directly coupled to any component of electronic device 2100. This may reduce the number of parts required to support button 2140 as no new components specific to mounting button 2140 are introduced.

Button 2140 may be coupled to switch 2144 (e.g., a dome switch) to provide inputs to the electronic device circuit boards. Switch 2144 may be coupled to board 2146, which may be located under aperture 2132 of bezel 2130. In some embodiments, switch 2144 may be directly coupled to button 2144, without the use of an intermediate component.

The above described embodiments of the invention are presented for purposes of illustration and not of limitation, and the present invention is limited only by the claims which follow.

What is claimed is:

1. An antenna assembly arranged within an electronic device operative to perform wireless communications operations, the antenna assembly comprising:
    an antenna for performing wireless communications operations; and
    a radio-transparent antenna chassis operative to receive the antenna, the radio-transparent antenna chassis coupled to an inside surface of a radio-opaque housing of the electronic device, the radio-opaque housing having an aperture carved from a curved surface of the radio opaque housing; and
    a radio-transparent antenna cap operative to close the aperture, the antenna cap inserted into the aperture from the outside of the radio-opaque housing by deforming the antenna cap, wherein the inserted antenna cap provides a smooth exterior surface across the aperture of the housing that fits tightly within the aperture to provide a flush outer surface for the electronic device, and wherein the inserted radio-transparent antenna cap is directly adjacent to the radio transparent antenna chassis.

2. The antenna assembly of claim 1, further comprising:
    a metallic grounding spring in direct contact with both the antenna and the radio-transparent housing,
    wherein the metallic grounding spring comprises a tab configured to fit into a slot of the antenna such that the metallic grounding spring is retained in position.

3. The antenna assembly of claim 2, wherein each cut forming the aperture is perpendicular to the outer surface of the housing at the location of the cut.

4. The antenna assembly of claim 1, wherein the radio-transparent antenna chassis is manufactured from one of low density plastic and foam.

5. The antenna assembly of claim 2, wherein the radio-transparent antenna chassis is manufactured from foam and the antenna is woven into the antenna chassis.

6. The antenna assembly of claim 1, wherein the radio-transparent antenna cap includes a plurality of tabs operative to engage a portion of the inner surface of the housing when the radio-transparent antenna cap is inserted in the aperture.

7. The antenna assembly of claim 1, wherein the radio transparent antenna cap is manufactured using a forced ejection molding process.

8. The antenna assembly electronic device of claim 1, further comprising:
    a screen; and
    a bezel, the bezel operative to be coupled with the housing and operative to receive the screen, the bezel comprising a window through which at least some radiation emanating from the antenna passes.

9. The antenna assembly of claim 8, wherein the aperture is aligned with the antenna chassis.

10. The antenna assembly of claim 8, wherein a portion of the screen that is over the aperture is opaque.

* * * * *